(12) United States Patent
Hoang et al.

(10) Patent No.: US 12,490,472 B2
(45) Date of Patent: Dec. 2, 2025

(54) SEMICONDUCTOR DEVICE AND SEMICONDUCTOR MEMORY DEVICE

(71) Applicant: Kioxia Corporation, Tokyo (JP)

(72) Inventors: Ha Hoang, Mie (JP); Kazuhiro Matsuo, Mie (JP); Kenichiro Toratani, Mie (JP)

(73) Assignee: Kioxia Corporation, Tokyo (JP)

(*) Notice: Subject to any disclaimer, the term of this patent is extended or adjusted under 35 U.S.C. 154(b) by 489 days.

(21) Appl. No.: 18/052,957

(22) Filed: Nov. 7, 2022

(65) Prior Publication Data

US 2023/0402548 A1 Dec. 14, 2023

(30) Foreign Application Priority Data

Jun. 10, 2022 (JP) .................................. 2022-094570

(51) Int. Cl.
*H01L 29/786* (2006.01)
*H10D 30/67* (2025.01)

(52) U.S. Cl.
CPC ..... *H10D 30/6755* (2025.01); *H10D 30/6757* (2025.01)

(58) Field of Classification Search
CPC .......... H10D 30/6755; H10D 30/6757; H10D 30/6728; H10B 12/05
USPC ....................................................... 257/43
See application file for complete search history.

(56) References Cited

U.S. PATENT DOCUMENTS

| | | | |
|---|---|---|---|
| 9,324,880 B2 | 4/2016 | Ono et al. | |
| 9,478,668 B2 | 10/2016 | Takahashi et al. | |
| 10,381,220 B2 | 8/2019 | Benwadih et al. | |
| 10,439,068 B2 | 10/2019 | Shimomura et al. | |
| 2009/0294844 A1* | 12/2009 | Tanaka | H10D 64/037 257/330 |
| 2016/0079268 A1* | 3/2016 | Sakuma | H10B 43/27 257/43 |
| 2018/0025905 A1 | 1/2018 | Yamazaki et al. | |
| 2018/0323311 A1 | 11/2018 | Zhai | |
| 2022/0068967 A1* | 3/2022 | Yamazaki | G11C 16/0466 |
| 2022/0139917 A1 | 5/2022 | Yamazaki et al. | |

* cited by examiner

*Primary Examiner* — Tong-Ho Kim
(74) *Attorney, Agent, or Firm* — Maier & Maier, PLLC

(57) ABSTRACT

In general, according to one embodiment, a semiconductor device includes first to third conductors, a semiconductor, a first insulator, and an insulation region. The semiconductor includes a metal oxide and extends in the first direction to be in contact with the first conductor and the third conductor. The insulation region is surrounded by the semiconductor and extends in the first direction to be in contact with the first conductor. The semiconductor includes a first portion and a second portion defined between the first portion and the insulation region. A concentration of a first element contained in the metal oxide of the semiconductor is higher in the second portion than in the first portion.

14 Claims, 25 Drawing Sheets

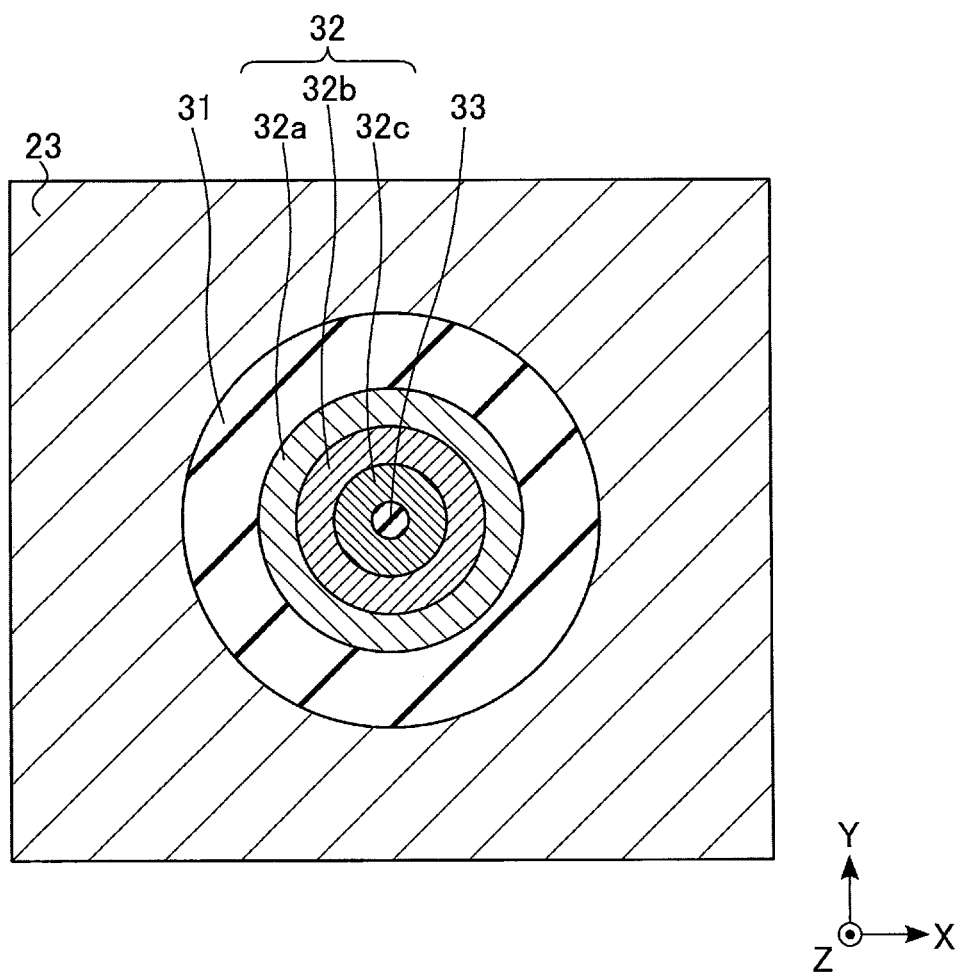
F I G. 4

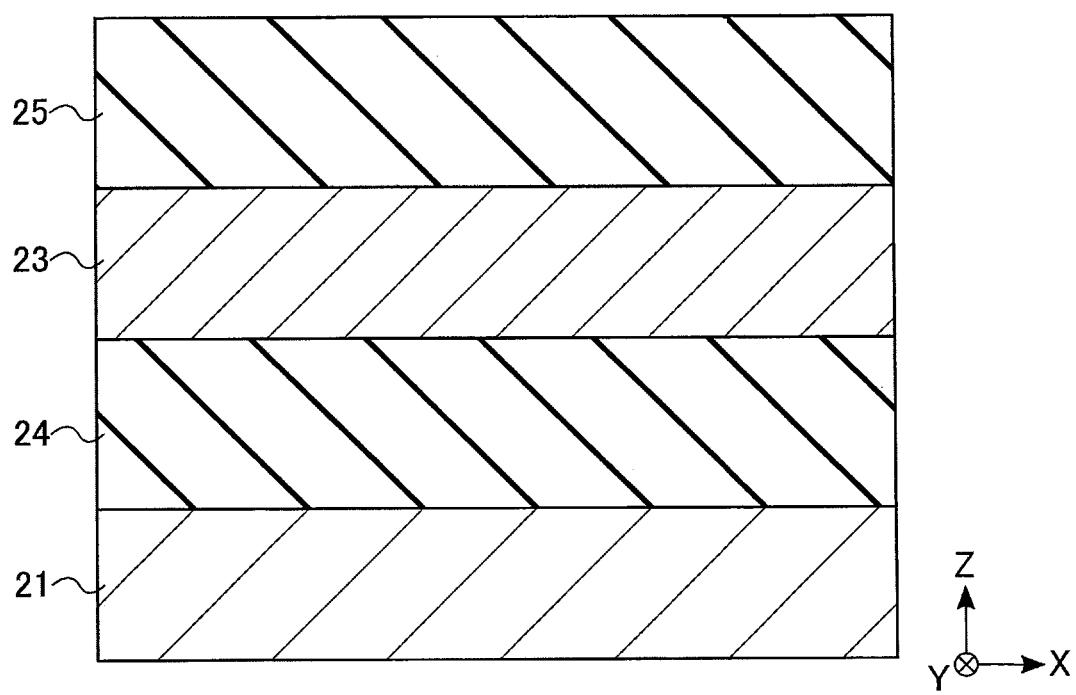
F I G. 8

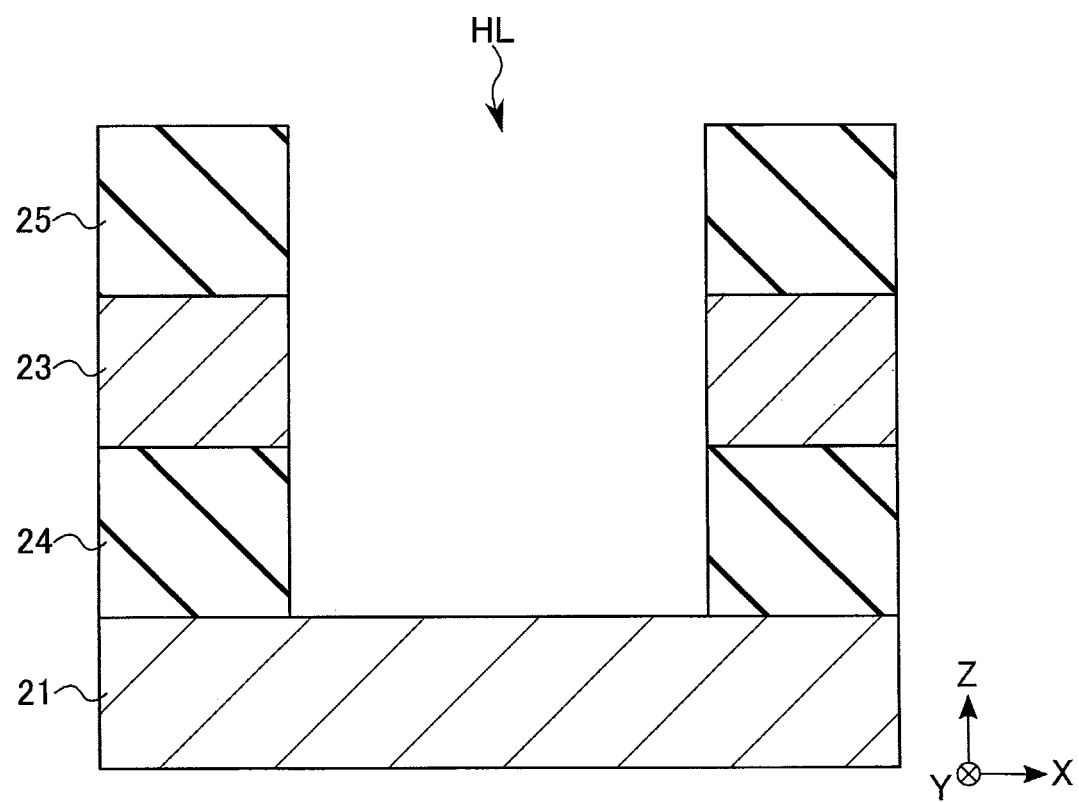
F I G. 9

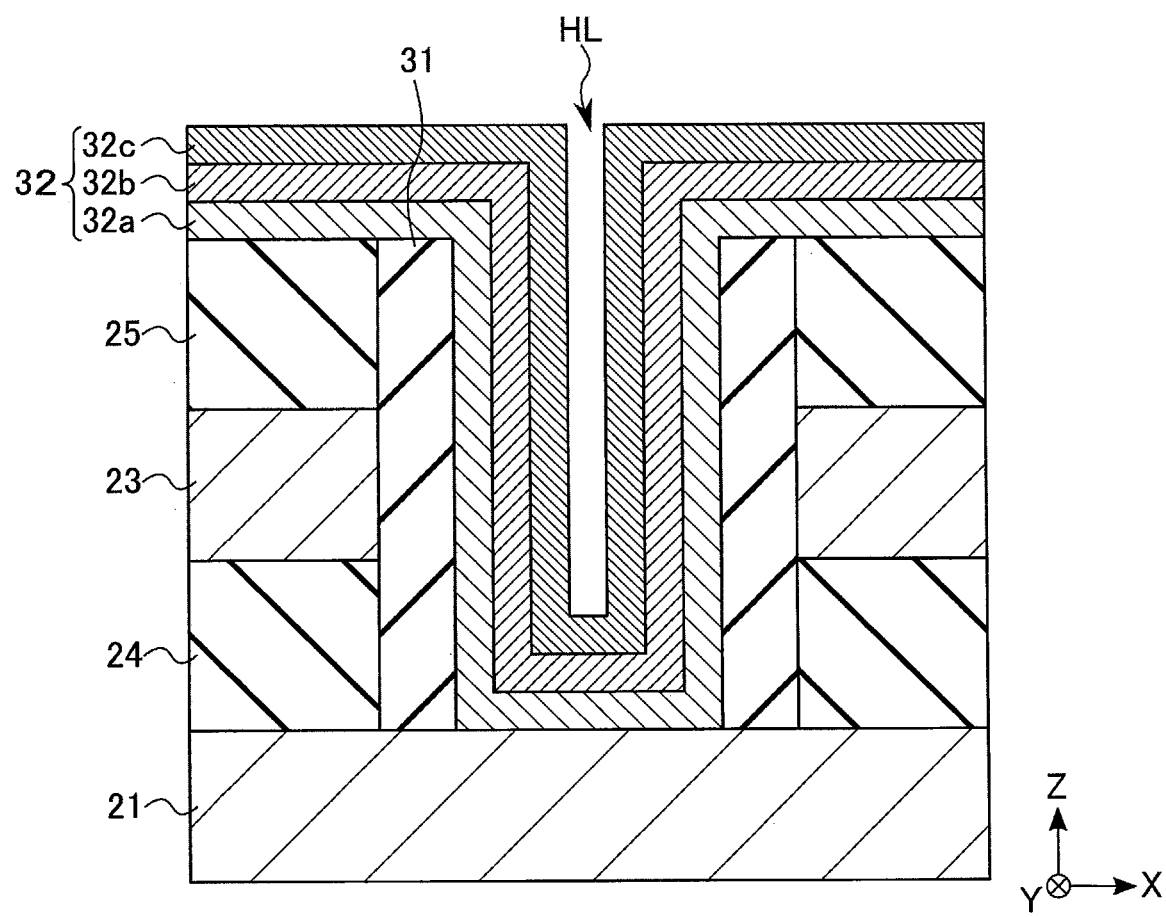
F I G. 12

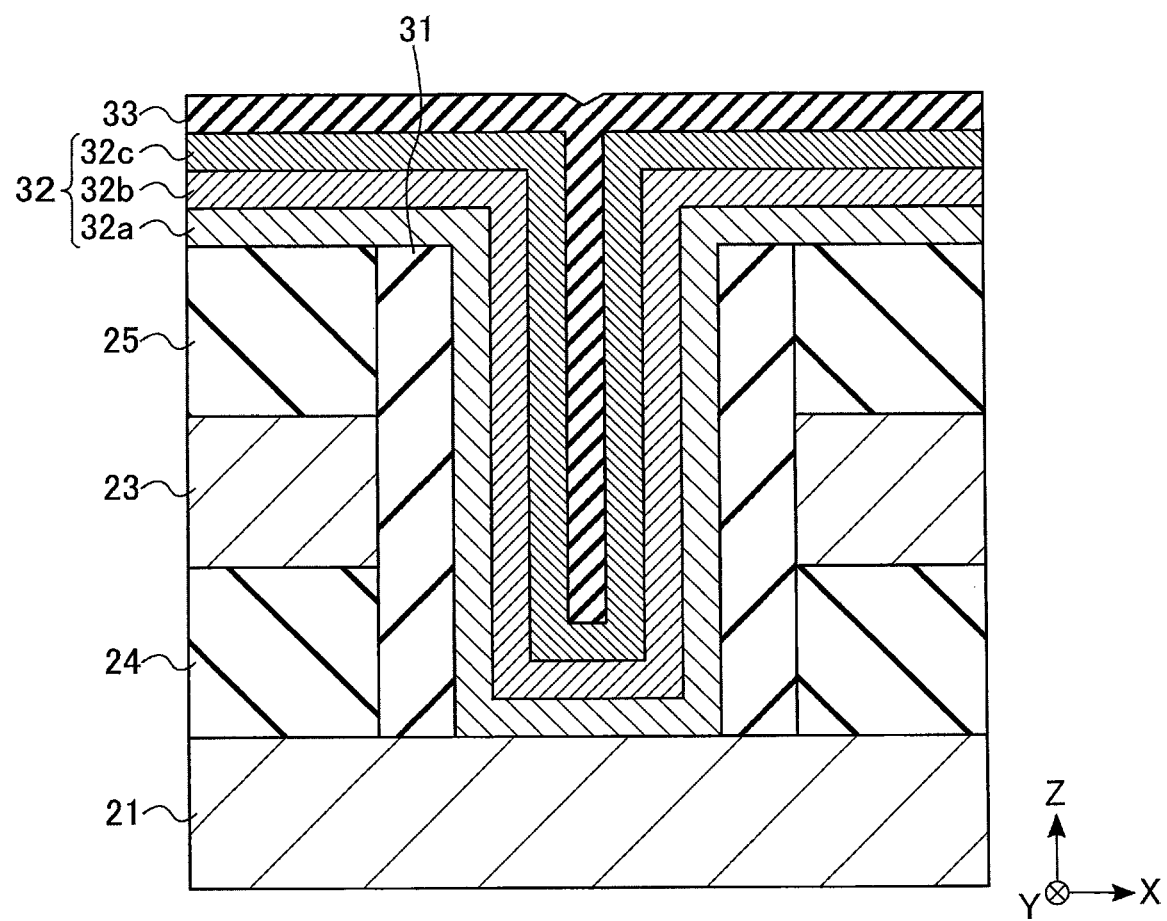
F I G. 13

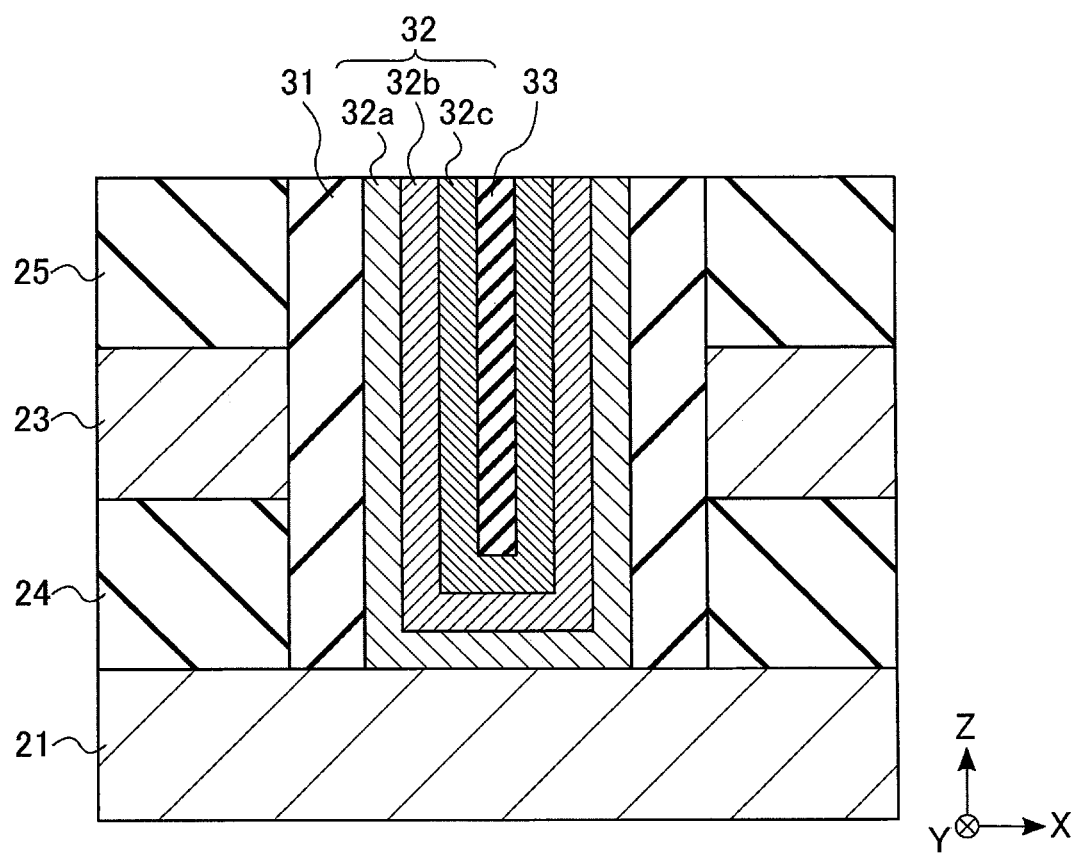
F I G. 14

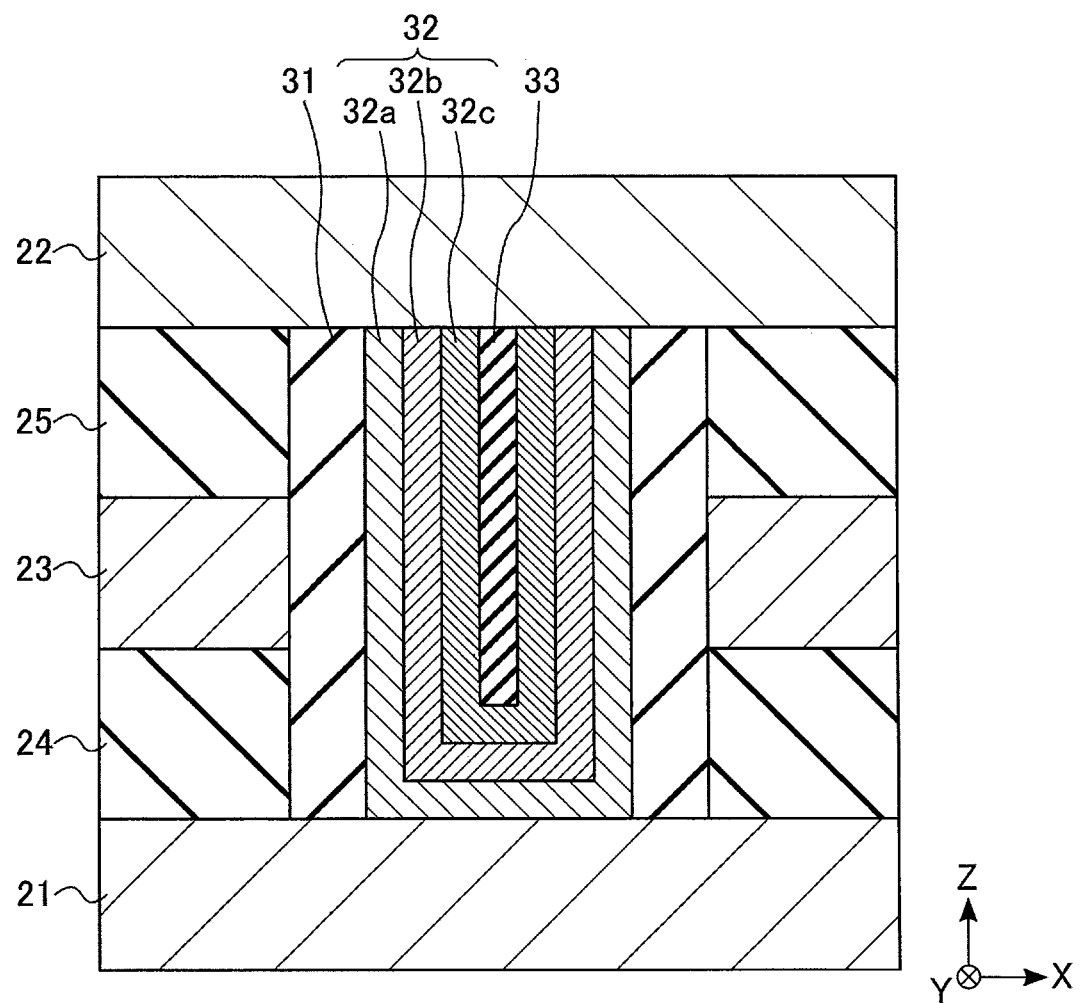
F I G. 16

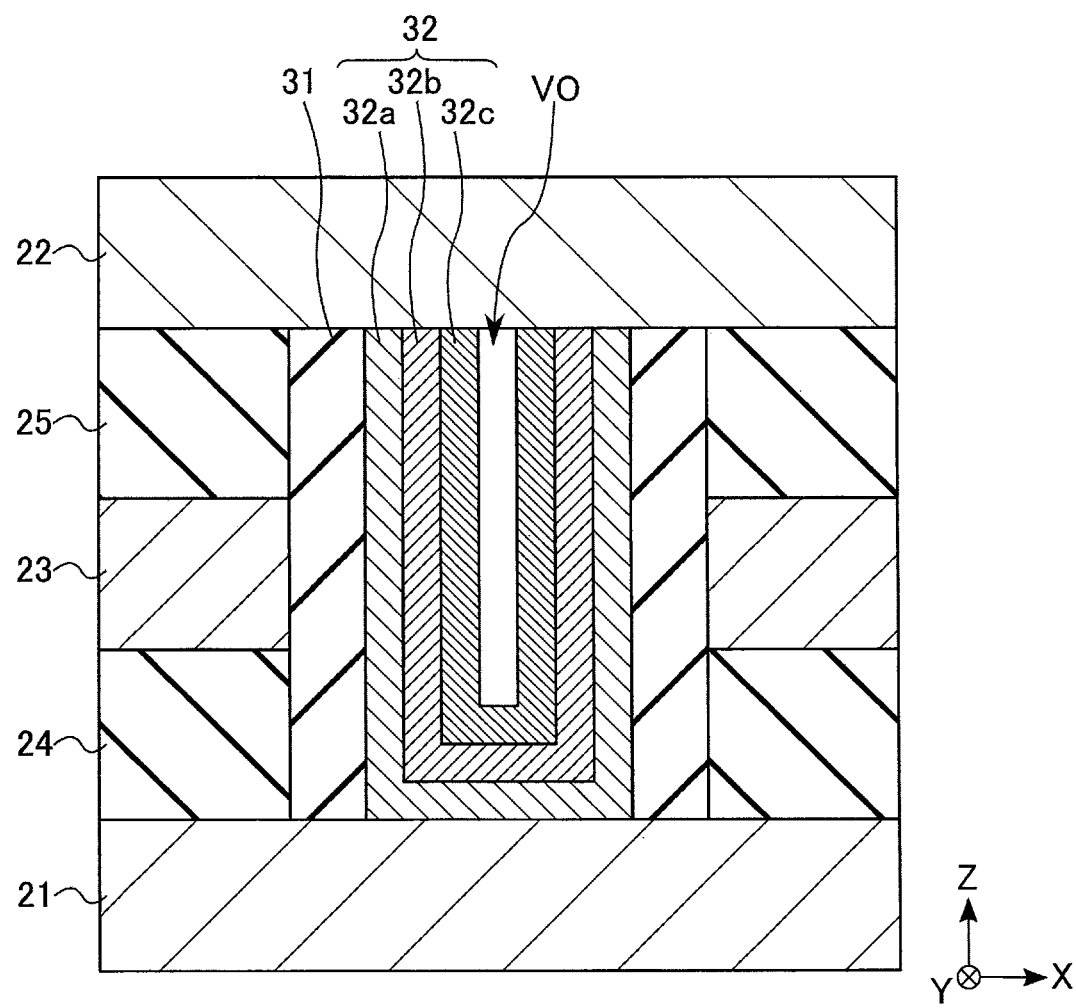
F I G. 17

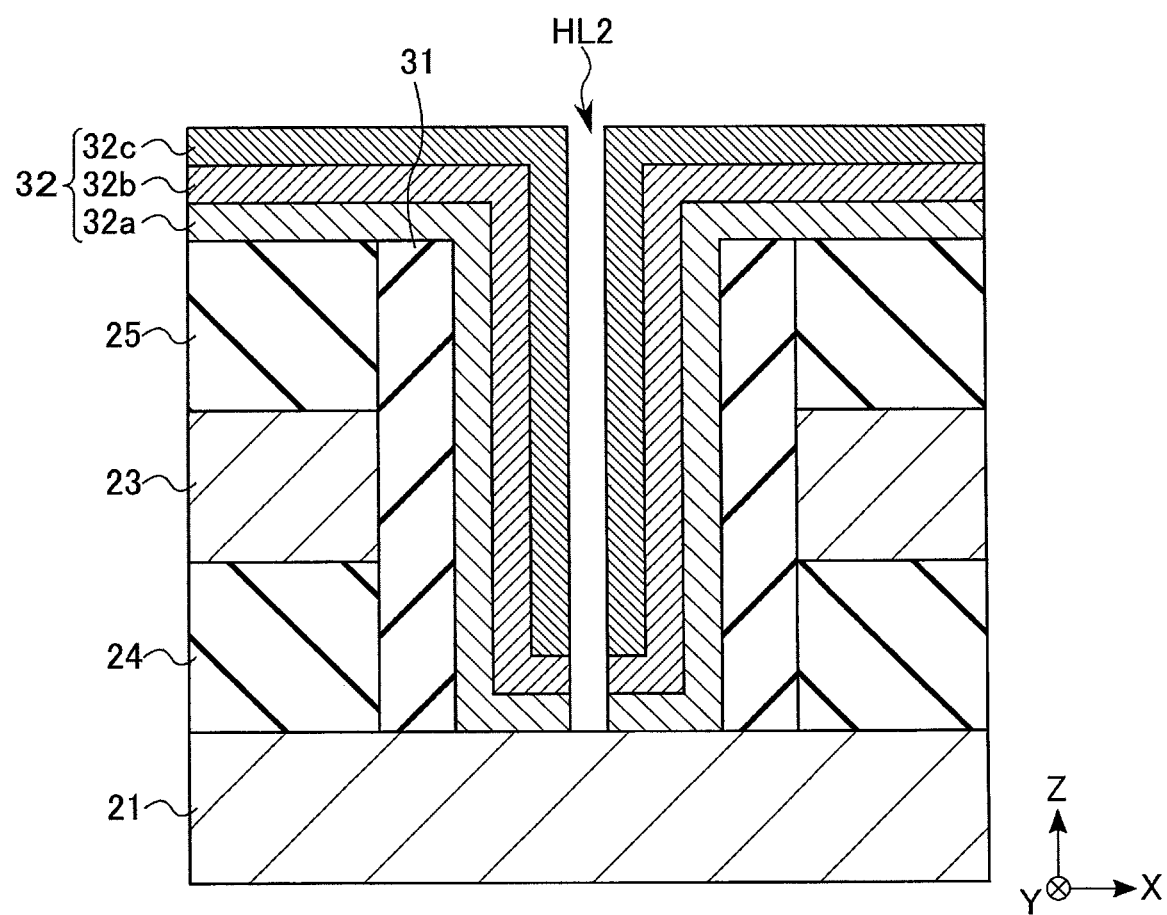
F I G. 20

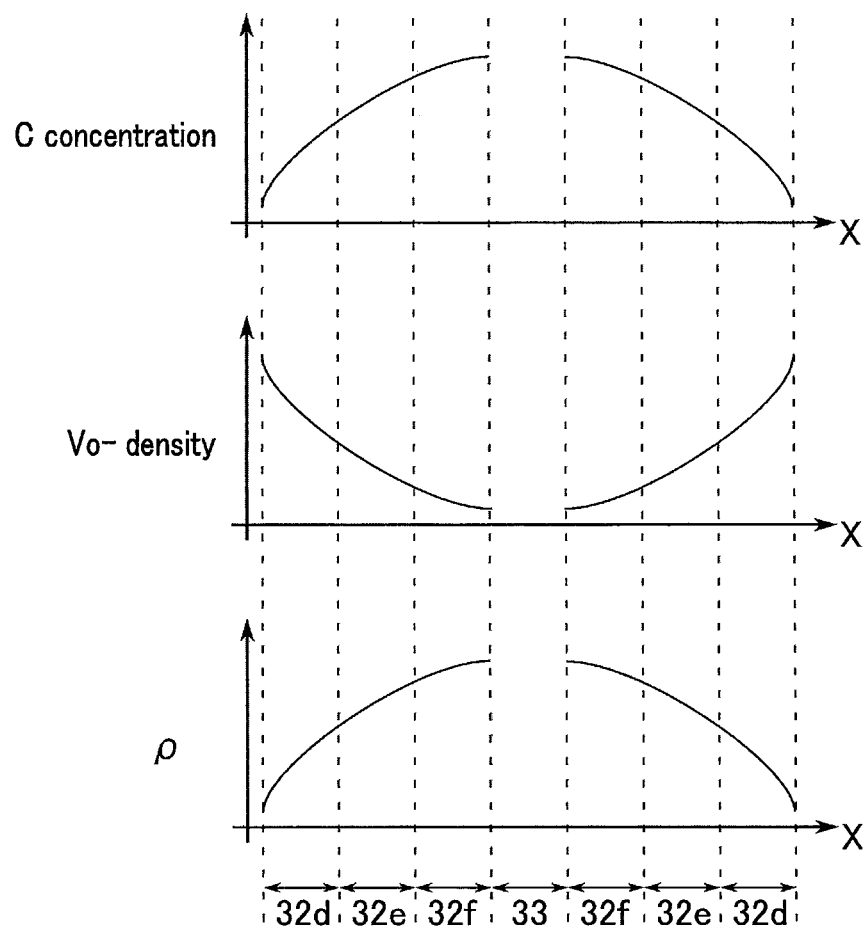
F I G. 22

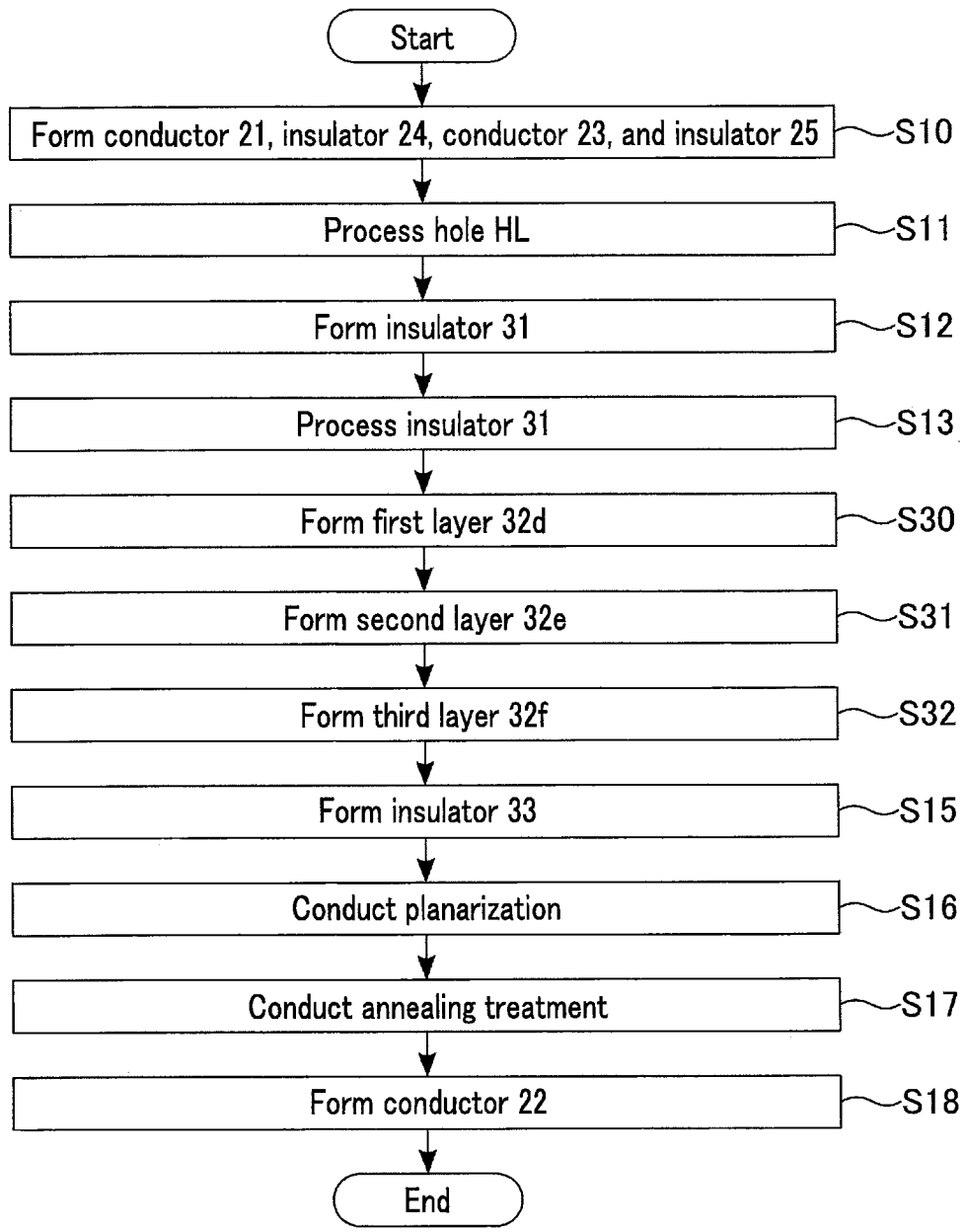
F I G. 24

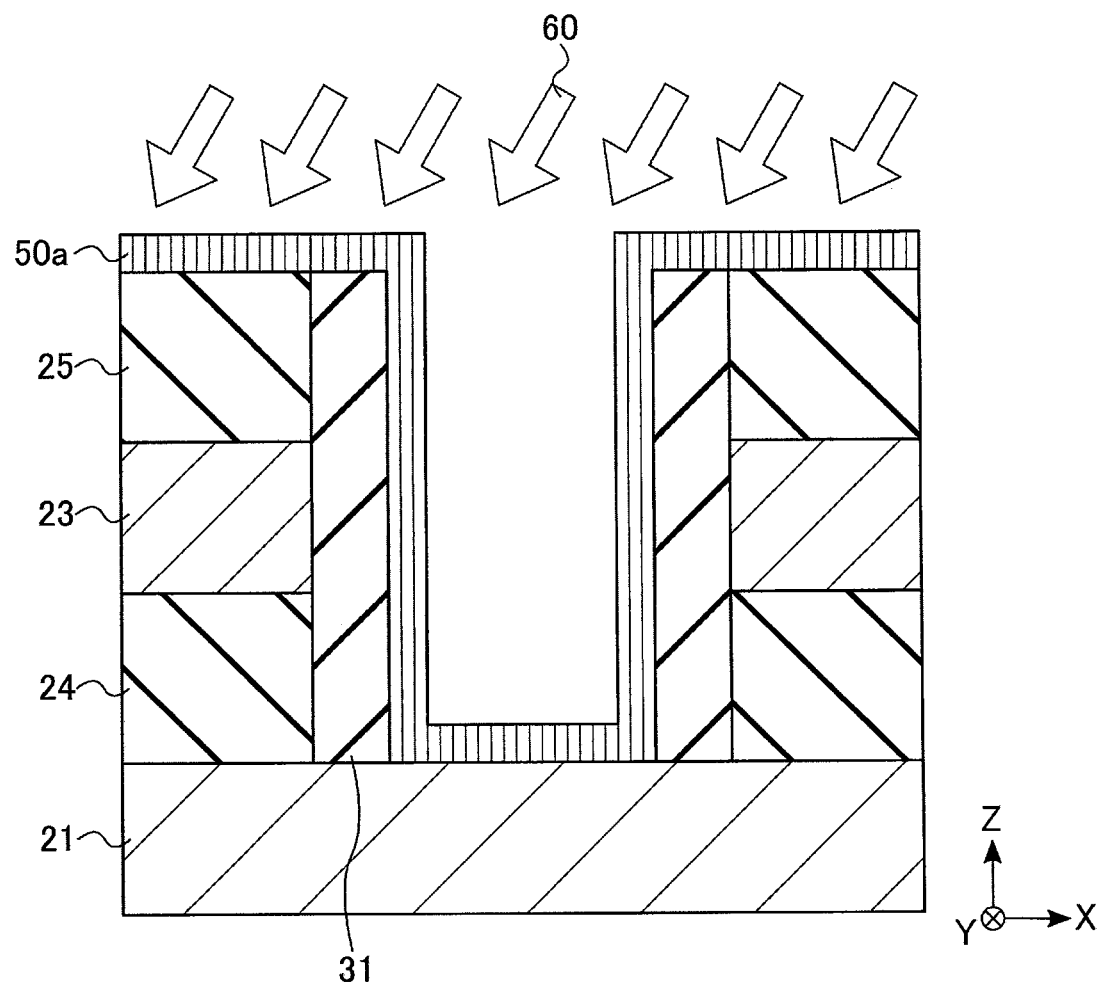
F I G. 25

SEMICONDUCTOR DEVICE AND SEMICONDUCTOR MEMORY DEVICE

CROSS-REFERENCE TO RELATED APPLICATIONS

This application is based upon and claims the benefit of priority from Japanese Patent Application No. 2022-094570, filed Jun. 10, 2022, the entire contents of which are incorporated herein by reference.

FIELD

Embodiments described herein relate generally to a semiconductor device and a semiconductor memory device.

BACKGROUND

A semiconductor device adopting an oxide semiconductor and a semiconductor memory device adopting such a semiconductor device have been known.

BRIEF DESCRIPTION OF THE DRAWINGS

FIG. 4 is a cross-sectional view showing the configuration of the transistor in the semiconductor memory device according to the first embodiment.

FIG. 8 is a cross-sectional view showing an exemplary cross-sectional structure of the semiconductor memory device according to the first embodiment in the manufacturing process.

FIG. 9 is a cross-sectional view showing an exemplary cross-sectional structure of the semiconductor memory device according to the first embodiment in the manufacturing process.

FIG. 12 is a cross-sectional view showing an exemplary cross-sectional structure of the semiconductor memory device according to the first embodiment in the manufacturing process.

FIG. 13 is a cross-sectional view showing an exemplary cross-sectional structure of the semiconductor memory device according to the first embodiment in the manufacturing process.

FIG. 14 is a cross-sectional view showing an exemplary cross-sectional structure of the semiconductor memory device according to the first embodiment in the manufacturing process.

FIG. 16 is a cross-sectional view showing an exemplary cross-sectional structure of the semiconductor memory device according to the first embodiment in the manufacturing process.

FIG. 17 is a cross-sectional view showing the configuration of a transistor according to a modification example of the first embodiment.

FIG. 20 is a cross-sectional view showing an exemplary cross-sectional structure of the semiconductor memory device according to the second embodiment in the manufacturing process.

FIG. 22 is a graph showing the properties of the transistor in the semiconductor memory device according to the third embodiment.

FIG. 24 is a flowchart of an exemplary manufacturing method for the semiconductor memory device according to the third embodiment.

FIG. 25 is a cross-sectional view showing an exemplary cross-sectional structure of the semiconductor memory device according to the third embodiment in the manufacturing process.

DETAILED DESCRIPTION

Figure 1:
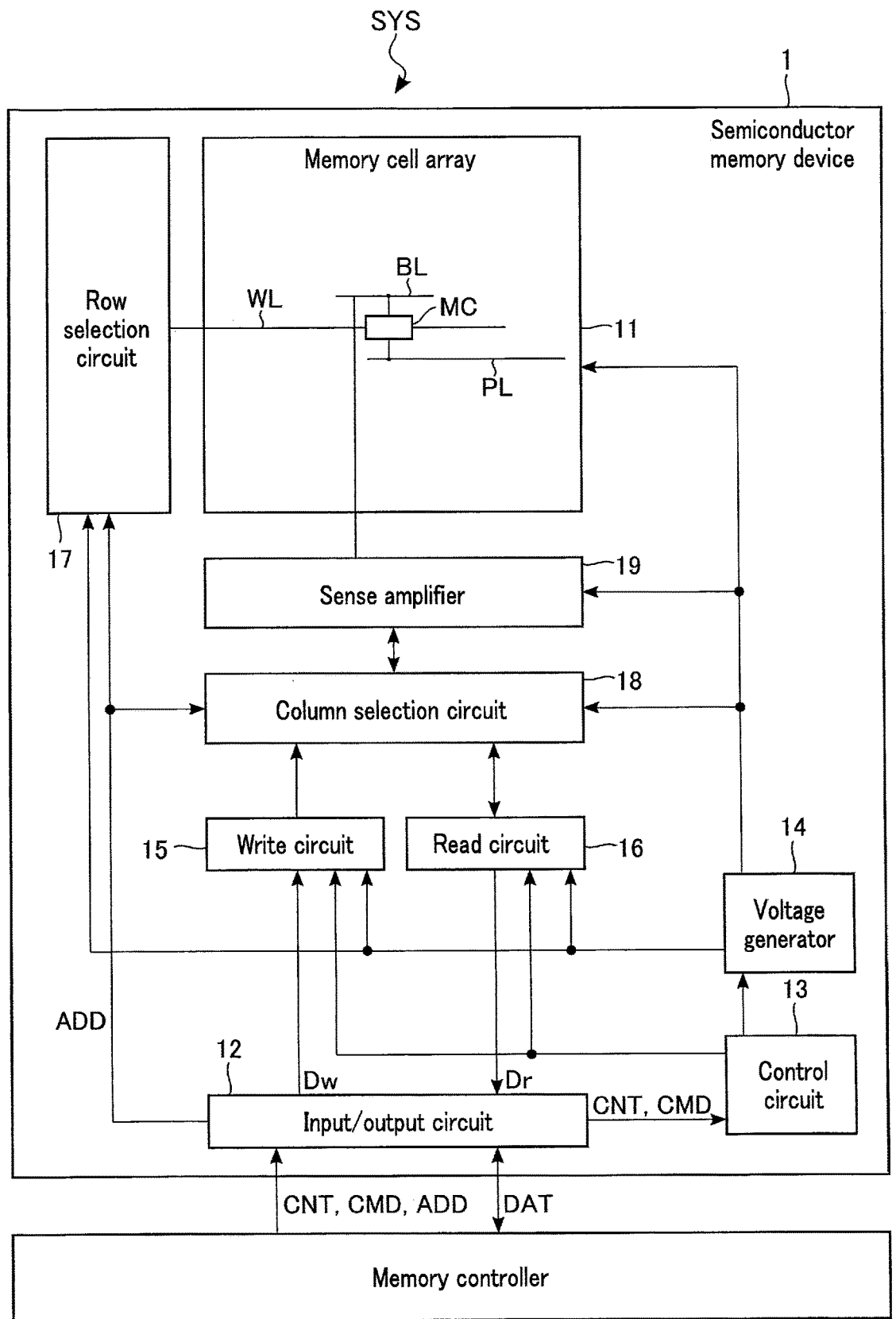
FIG. 1 is a block diagram showing the configuration of a memory system including a semiconductor memory device according to the first embodiment.

In general, according to one embodiment, a semiconductor device includes a first conductor, a second conductor, a third conductor, a semiconductor, a first insulator, and an insulation region. The first conductor, the second conductor, and the third conductor are aligned in a first direction and are separated from each other. The semiconductor includes a metal oxide and extends in the first direction to be in contact with the first conductor and the third conductor. The first insulator is arranged between the semiconductor and the second conductor. The insulation region is surrounded by the semiconductor and extends in the first direction to be in contact with the first conductor. The semiconductor includes a first portion and a second portion defined between the first portion and the insulation region. A concentration of a first element contained in the metal oxide of the semiconductor is higher in the second portion than in the first portion.

The embodiments will be described by referring to the drawings. In the explanation, structural components having basically the same functions and structures will be referred to by the same reference symbols. The embodiments described below are to embody the technical concept, and therefore do not restrict the materials, forms, structures, arrangements or the like of the structural components. Various modifications can be made to the embodiments.

(1) First Embodiment

(1-1) Configuration

The configuration of the semiconductor memory device according to the first embodiment will be described.

(1-1-1) Semiconductor Memory Device

FIG. 1 is a block diagram showing the configuration of a memory system that includes a semiconductor memory device according to the present first embodiment. A memory system SYS is a memory device. The memory system SYS implements a data write operation and data read operation in response to a command from a not-shown external host device. As illustrated in FIG. 1, the memory system SYS includes a semiconductor memory device 1 and a memory controller 2. The semiconductor memory device 1 is a memory device that employs a transistor for selection of a memory element. The semiconductor memory device 1 may store data through the use of a capacitor, or through the use of a ferromagnet. In this specification, a configuration adopting a dynamic random access memory (DRAM) as the semiconductor memory device 1 and a transistor as the semiconductor device will be described. The semiconductor memory device 1 is controlled by the memory controller 2. The semiconductor memory device 1 includes a memory cell array 11, an input/output circuit 12, a control circuit 13, a voltage generator 14, a write circuit 15, a read circuit 16, a row selection circuit 17, a column selection circuit 18, and a sense amplifier 19.

The memory cell array 11 includes multiple memory cells MC, multiple word lines WL, multiple bit lines BL, and a plate line PL. Each memory cell MC stores 1-bit data. Each memory cell MC is coupled between one of the bit lines BL and the plate line PL and is also coupled to one of the word lines WL. Each word line WL is associated with a row, while each bit line BL is associated with a column. With a selection of one row and one column, one memory cell MC is identified.

The input/output circuit 12 receives control signals CNT, commands CMD, address signals ADD, and data DAT from the memory controller 2. The input/output circuit 12 transmits data DAT to the memory controller 2. When writing data into the semiconductor memory device 1, the data DAT is write data. When reading data from the semiconductor memory device 1, the data DAT is read data.

The control circuit 13 receives control signals CNT and commands CMD from the input/output circuit 12. Based on the control indicated by the control signals CNT and also on the commands CMD, the control circuit 13 controls the write circuit 15 and read circuit 16.

Under the control by the control circuit 13, the voltage generator 14 generates voltages of different levels. The voltage generator 14 supplies the generated voltages to the memory cell array 11, write circuit 15, read circuit 16, row selection circuit 17, column selection circuit 18, and sense amplifier 19.

The write circuit 15 performs processing and control for writing data into memory cells MC. The write circuit 15 receives write data Dw from the input/output circuit 12. The write data Dw represents data to be written into a data-write target memory cell MC. The write circuit 15 receives from the voltage generator 14 one or more voltages to be used for data writing, and supplies to the column selection circuit 18 the one or more voltages to be used for data writing, in accordance with the control by the control circuit 13 and the write data Dw.

The read circuit 16 performs processing and control for reading data from the memory cells MC. The read circuit 16 receives from the voltage generator 14 one or more voltages to be used for data reading, and makes a determination, in accordance with the control by the control circuit 13, upon the data stored in a memory cell MC through the use of the voltage used for data reading. The determined data is supplied as read data Dr to the input/output circuit 12.

The row selection circuit 17 receives an address signal ADD from the input/output circuit 12. The row selection circuit 17 supplies the voltage received from the voltage generator 14 to the memory cell array 11 so that a word line WL associated with the row specified by the received address signal ADD can be brought into a selected state.

The column selection circuit 18 receives an address signal ADD from the input/output circuit 12. The column selection circuit 18 supplies the voltage received from the voltage generator 14 to the memory cell array 11 so that a bit line BL associated with the column specified by the received address signal ADD can be brought into a selected state.

The sense amplifier 19 receives multiple voltages from the voltage generator 14, and performs operations through the use of the received voltages. During the data reading, the sense amplifier 19 amplifies the voltage on the bit line BL for the determination of the data stored in the data-read target memory cell MC.

(1-1-2) Memory Cell

Figure 2:
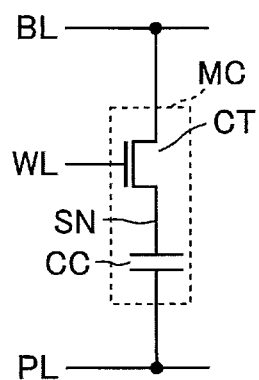
FIG. 2 is a circuit diagram showing the configuration of a memory cell in the semiconductor memory device according to the first embodiment.

Next, the configuration of a memory cell in the semiconductor memory device according to the first embodiment will be described with reference to FIG. 2, which is a circuit diagram showing the configuration of a memory cell in the semiconductor memory device according to the first embodiment. Each memory cell MC includes a cell capacitor CC and a transistor CT, which is an n-type metal oxide semiconductor field effect transistor (MOSFET), as illustrated in FIG. 2. The cell capacitor CC has one electrode coupled to the plate line PL and the other electrode coupled to one end (the first end) of the transistor CT. The cell capacitor CC stores data using the charge accumulated in a node that connects the cell capacitor CC to the transistor CT. The node connecting the cell capacitor CC to the transistor CT may be referred to as a "storage node SN". The state of whether or not charge is accumulated in the storage node SN corresponds to the state of the memory cell MC storing "1" data or storing "0" data. In the following example, the state of charge accumulated in the storage node SN will be regarded as the state of the memory cell MC storing "1" data, while the state of no charge accumulated in the storage node SN will be regarded as the state of the memory cell MC storing "0" data. The other end (second end) of the transistor CT is coupled to a bit line BL, and the gate of the transistor CT is coupled to a word line WL.

(1-1-3) Transistor

Next, the configuration of a transistor in the semiconductor memory device according to the first embodiment will be described with reference to FIG. 3.

Figure 3:
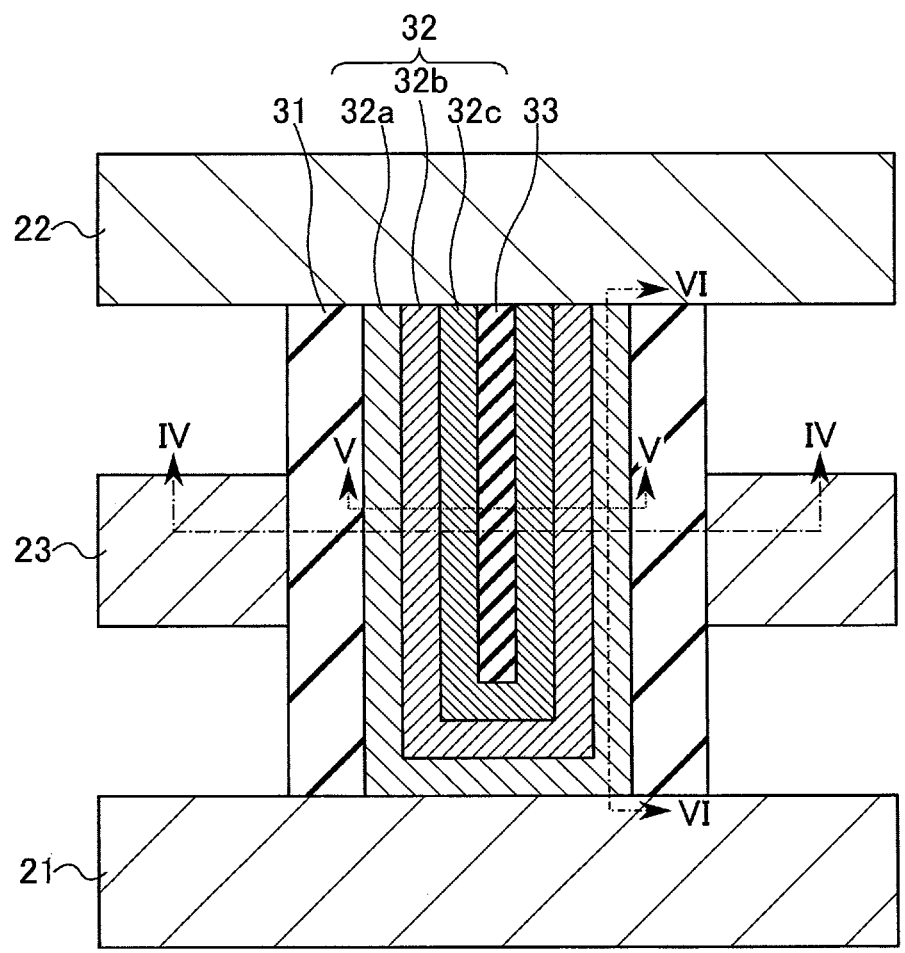
FIG. 3 is a cross-sectional view showing the configuration of a transistor in the semiconductor memory device according to the first embodiment.
Figure 3:
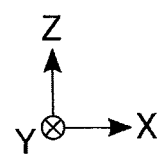

FIG. 3 is a cross-sectional view showing the configuration of a transistor in the semiconductor memory device according to the first embodiment. A transistor CT includes conductors 21, 22 and 23, insulators 31 and 33, and a semiconductor 32, as illustrated in FIG. 3. The semiconductor 32 includes a first layer 32a, a second layer 32b, and a third layer 32c.

The conductor 21 serves as the first end or the second end of the transistor CT. The conductor 21 is arranged above a not-shown substrate.

The conductor 22 serves as the second end or the first end of the transistor CT. The conductor 22 is arranged above the conductor 21.

The conductor 23 serves as a gate electrode of the transistor CT. The conductor 23 is arranged above the conductor 21 and below the conductor 22. Not-shown interlayer insulating films are deposited between the conductor 21 and conductor 23 and between the conductor 22 and conductor 23.

The insulator 33 extends in the Z direction. The upper surface of the insulator 33 is in contact with the conductor 22, while the bottom surface of the insulator 33 may be positioned between the conductor 21 and conductor 23. The insulator 33 may contain silicon oxide ($SiO2$). The insulator 33 has a film density lower than that of the insulator 31, which will be described later, so as to allow, for example, oxygen to permeate.

The semiconductor 32 serves as a channel of the transistor CT. The semiconductor 32 is in contact with the side surface and bottom surface of the insulator 33, establishing an electrical connection between the conductor 21 and conductor 22. Specifically, the third layer 32c is in contact with the side surface and bottom surface of the insulator 33, and the upper surface of the third layer 32c is in contact with the conductor 22. The second layer 32b is in contact with the side surface and bottom surface of the third layer 32c, and the upper surface of the second layer 32b is in contact with the conductor 22. The first layer 32a is in contact with the side surface and bottom surface of the second layer 32b. The upper surface of the first layer 32a is in contact with the conductor 22, and the bottom surface of the first layer 32a is in contact with the conductor 21.

The semiconductor 32 contains a metal oxide having characteristics of a semiconductor. The semiconductor 32 may contain impurities other than a metal oxide. The semiconductor 32 may contain oxygen (O) and at least one element selected from indium (In), gallium (Ga), silicon (Si), aluminum (Al), zinc (Zn), and tin (Sn). In particular, the semiconductor 32 may contain In, Ga, Zn, and O, or may contain In, Al, Zn, and O. In this embodiment, it is assumed that the semiconductor 32 contains an oxide of In, Ga, and Zn.

The insulator 31 serves as a gate insulating film of the transistor CT. The insulator 31 covers the side surface of the semiconductor 32. The insulator 31 may contain a silicon oxide. The insulator 31 has a film density higher than that of the insulator 33 so as to not allow, for example, oxygen to permeate.

FIG. 4 is a cross-sectional view showing the configuration of a transistor in the semiconductor memory device according to the first embodiment. FIG. 4 corresponds to a cross-sectional view of the configuration of FIG. 3, taken along line IV-IV. Provided at the center of the transistor is the insulator 33. The semiconductor 32 surrounds the insulator 33. In particular, the third layer 32c is provided to surround the insulator 33. The second layer 32b is provided to surround the third layer 32c. The first layer 32a is provided to surround the second layer 32b. The insulator 31 is provided to surround the semiconductor 32. The conductor 23 is provided to surround the insulator 31.

Hereinafter, a position of the semiconductor 32 closer to the center where the insulator 33 is provided will be referred to as "inside" on the XY plane, whereas a position of the semiconductor 32 closer to the outer periphery where the first layer 32a is provided will be referred to as "outside". For instance, the second layer 32b is positioned inside with respect to the first layer 32a, and the second layer 32b is positioned outside with respect to the third layer 32c.

The intensity of the electric field generated from the gate electrode decreases in accordance with the distance from the gate electrode. That is, the electric field applied to the channel becomes stronger toward the outside and weaker toward the inside. For instance, the electric field applied to the third layer 32c is weaker than the electric field applied to the second layer 32b, and weaker than the electric field applied to the first layer 32a. The electric field applied to the second layer 32b is weaker than the electric field applied to the first layer 32a.

Figure 5:
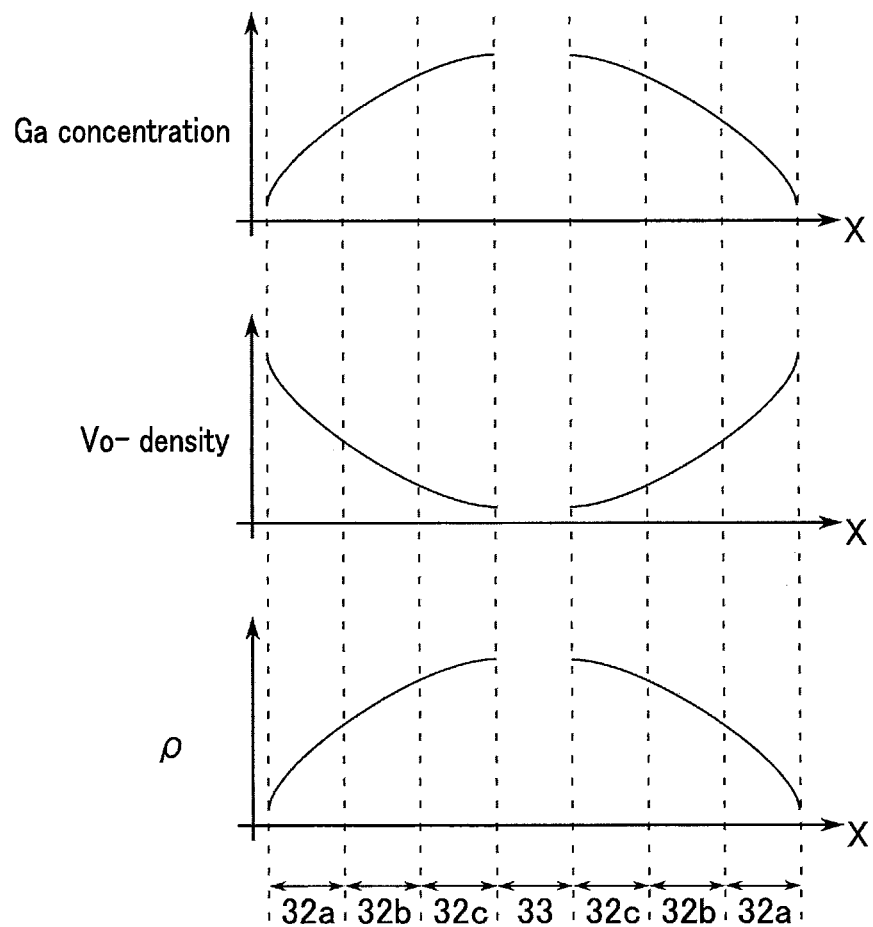
FIG. 5 is a graph showing the properties of the transistor in the semiconductor memory device according to the first embodiment.

FIG. 5 is a graph showing the properties of a transistor in the semiconductor memory device according to the first embodiment. FIG. 5 represents the properties for the configuration of FIG. 3 taken along line V-V, where the graph includes the concentration of a metallic element with the largest oxygen-bonding energy of all the elements contained in the semiconductor 32, the density of oxygen vacancies Vo-, and the resistivity $\rho$. Throughout the specification, the concentration of an element denotes the concentration in percent by mass. In this example, of the elements contained in the semiconductor 32, gallium is the metallic element demonstrating the largest oxygen-bonding energy. As shown in FIG. 5, the concentration of gallium in the semiconductor 32 is higher toward the inside on the XY plane. In particular, the gallium concentration in the third layer 32c is higher than the gallium concentration in the second layer 32b. The gallium concentration in the second layer 32b is higher than the gallium concentration in the first layer 32a. In the semiconductor 32, the density of oxygen vacancies increases toward the outside on the XY plane. In particular, the density of oxygen vacancies in the first layer 32a is higher than the density of oxygen vacancies in the second layer 32b. The density of oxygen vacancies in the second layer 32b is higher than the density of oxygen vacancies in the third layer 32c. In the semiconductor 32, the resistivity increases toward the inside on the XY plane. In particular, the resistivity of the third layer 32c is higher than the resistivity of the second layer 32b. The resistivity of the second layer 32b is higher than the resistivity of the first layer 32a. The concentration of an element can be measured by transmission electron microscope-energy dispersive X-ray spectroscopy (TEM-EDX). The difference between the highest and lowest gallium concentrations may be 5% or more.

Figure 6:
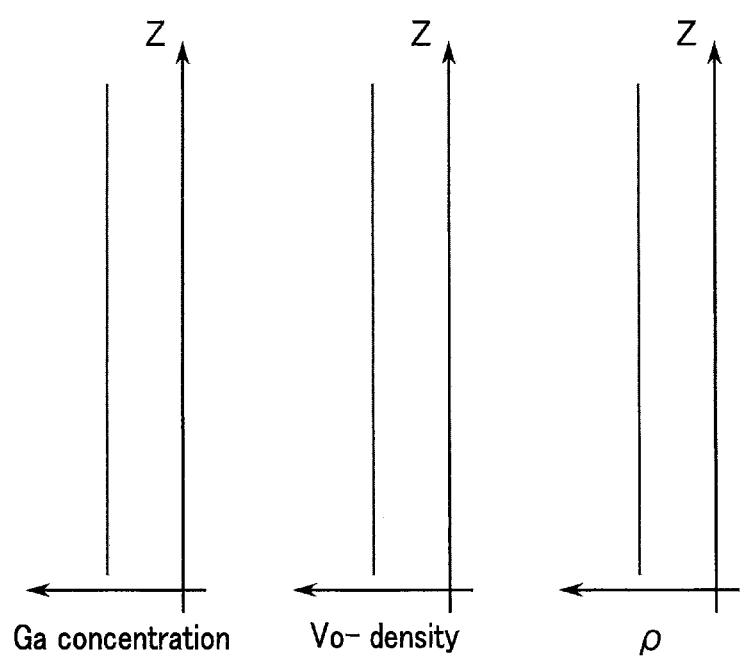
FIG. 6 is a graph showing the properties of the transistor in the semiconductor memory device according to the first embodiment.

FIG. 6 is a graph showing the properties of a transistor in the semiconductor memory device according to the first embodiment. FIG. 6 represents the properties for the configuration of FIG. 3 taken along line VI-VI. As shown in FIG. 6, the semiconductor 32 has approximately uniform values for each of the gallium concentration, the density of oxygen vacancies Vo-, and the resistivity $\rho$, with respect to the Z direction.

(1-2) Manufacturing Method

Figure 7:
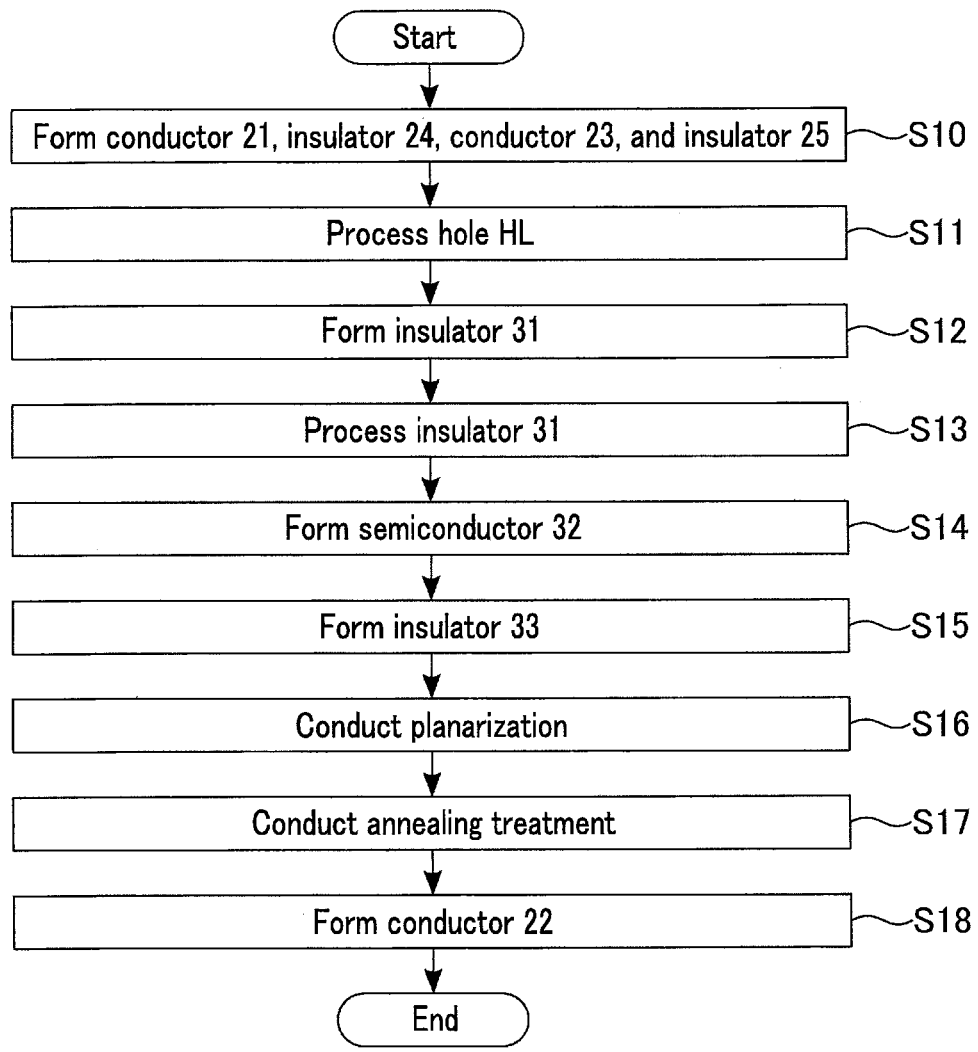
FIG. 7 is a flowchart of an exemplary manufacturing method for the semiconductor memory device according to the first embodiment.

FIG. 7 is a flowchart of an exemplary manufacturing method for the semiconductor memory device according to the first embodiment. FIGS. 8 to 16 are cross-sectional views of the semiconductor memory device according to the first embodiment in different stages of the manufacturing process. The illustrated cross-sectioned structures correspond to the area indicated in FIG. 3. As indicated in FIG. 7, the operations at S10 to S18 are sequentially performed in the manufacturing process of the semiconductor memory device according to the first embodiment. An exemplary manufacturing process will be described by suitably referring to FIG. 7.

First, as illustrated in FIG. 8, a conductor 21, an insulator 24, a conductor 23, and an insulator 25 are formed sequentially in this order (S10). For the formation of the conductors 21 and 23, sputtering may be adopted.

Next, as illustrated in FIG. 9, a hole HL is formed (S11). The hole HL provides a space for forming an insulator 31, a semiconductor 32, and an insulator 33. The hole HL may be produced by photolithography and anisotropic etching from the upper surface of the insulator 25 to reach the upper surface of the conductor 21. For anisotropic etching, reactive ion etching (RIE) may be adopted.

Figure 10:
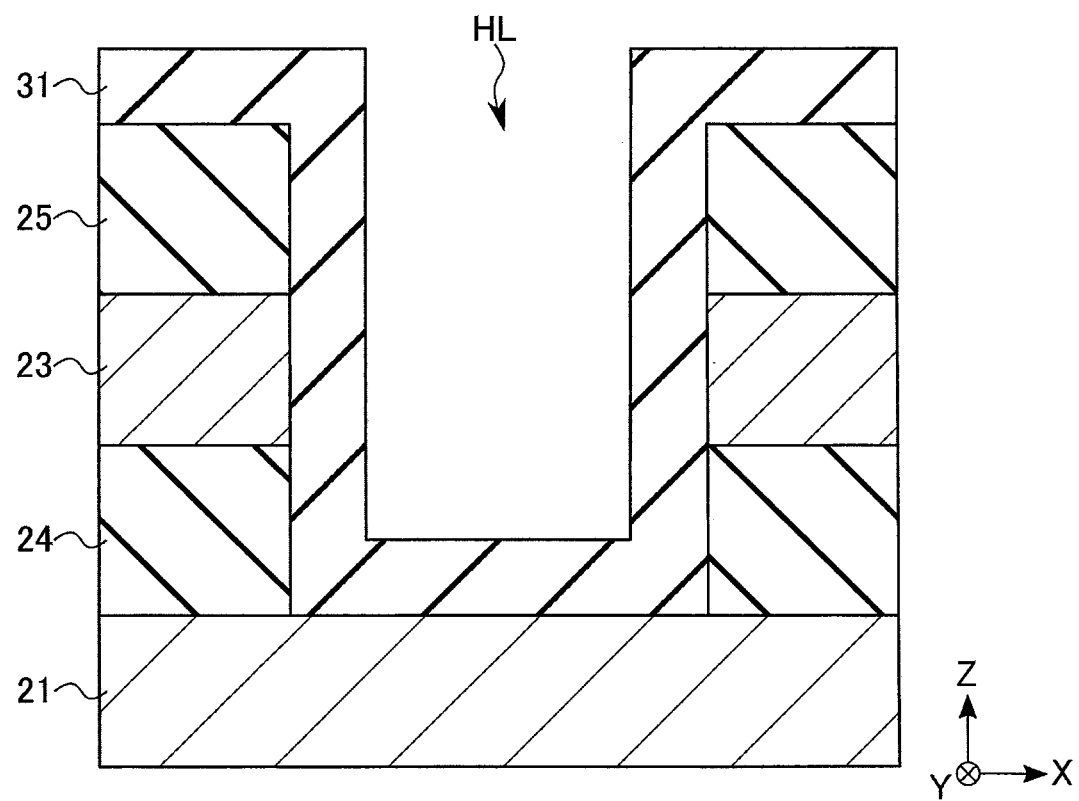
FIG. 10 is a cross-sectional view showing an exemplary cross-sectional structure of the semiconductor memory device according to the first embodiment in the manufacturing process.

Thereafter, as illustrated in FIG. 10, an insulator 31 is formed (S12). The insulator 31 may be formed on the upper surface of the insulator 25 and on the interior wall and bottom surface of the hole HL, for example by chemical vapor deposition (CVD).

Figure 11:
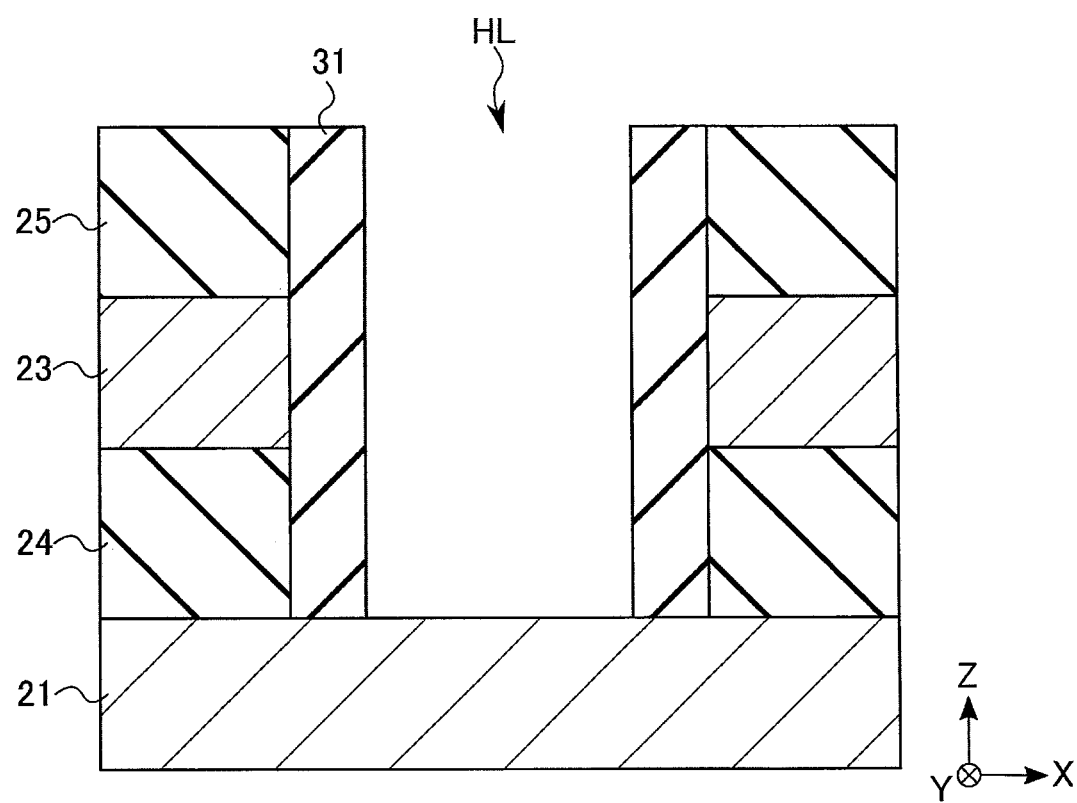
FIG. 11 is a cross-sectional view showing an exemplary cross-sectional structure of the semiconductor memory device according to the first embodiment in the manufacturing process.

Next, as illustrated in FIG. 11, the insulator 31 is processed (S13). In particular, a portion of the insulator 31 formed on the insulator 25 and a portion of the insulator 31 formed on the bottom surface of the hole HL are removed through anisotropic etching such as RIE.

Then, as illustrated in FIG. 12, a semiconductor 32 is formed (S14). In particular, the first layer 32a is formed on the upper surface of the insulator 25, the upper surface and side wall of the insulator 31, and the upper surface of the conductor 21, for example through atomic layer deposition (ALD). Furthermore, the second layer 32b is formed on the upper surface and side wall of the first layer 32a, and the third layer 32c is formed on the upper surface and side wall of the second layer 32b. The second layer 32b is formed to have a gallium concentration higher than that of the first layer 32a. The third layer 32c is formed to have a gallium concentration higher than that of the second layer 32b.

Thereafter, as illustrated in FIG. 13, an insulator 33 is formed (S15). In particular, the insulator 33 is formed on the upper surface and side wall of the third layer 32c so as to fill the hole HL.

Next, as illustrated in FIG. 14, a planarization is conducted (S16). In particular, portions of the first layer 32a, second layer 32b, third layer 32c and insulator 33 above the level of the insulator 25 are removed through chemical mechanical polishing (CMP).

Figure 15:
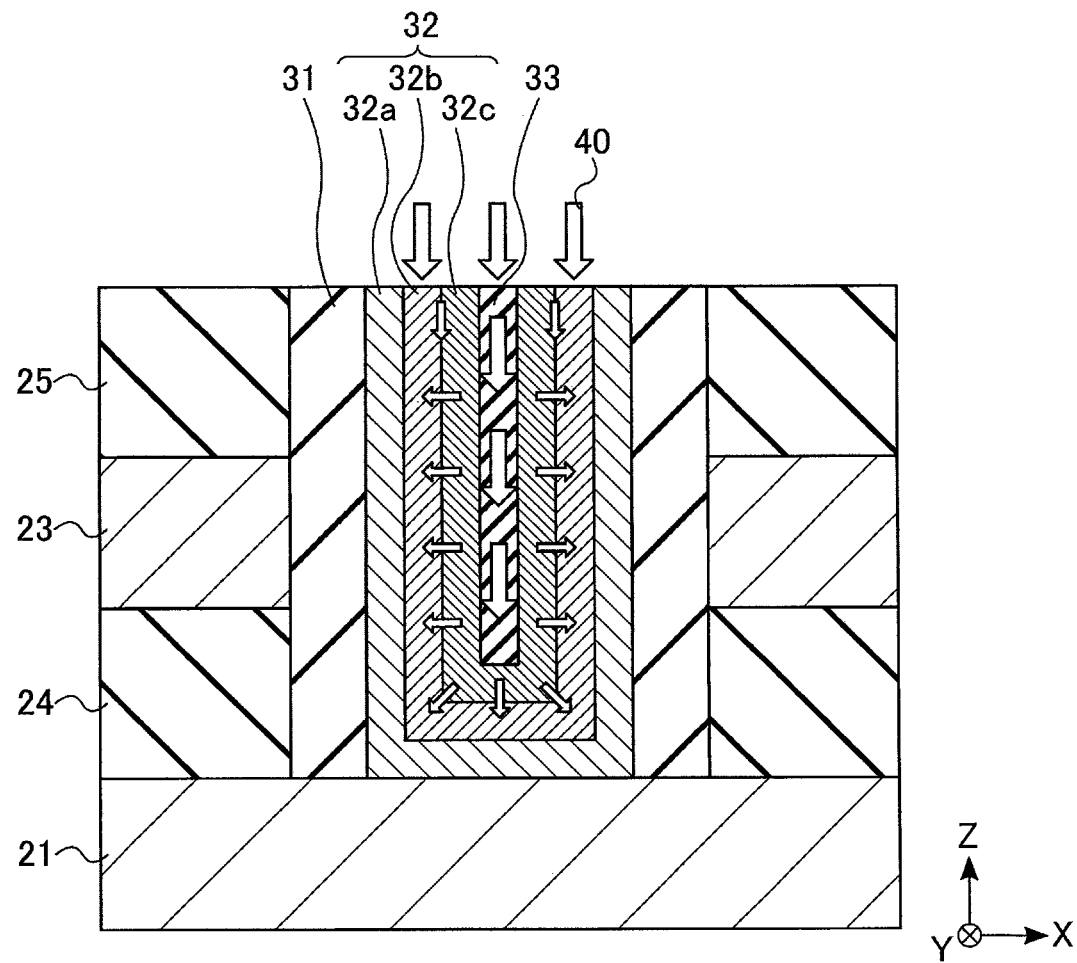
FIG. 15 is a cross-sectional view showing an exemplary cross-sectional structure of the semiconductor memory device according to the first embodiment in the manufacturing process.

Thereafter, as illustrated in FIG. 15, an annealing treatment is conducted (S17). In particular, with the annealing treatment conducted in the oxygen containing atmosphere, oxygen is taken into the semiconductor 32. The oxygen enters through the upper surfaces of the first layer 32a, second layer 32b, and third layer 32c. The oxygen also enters via the insulator 33 through the side wall of the third layer 32c. Arrows 40 in FIG. 15 represent the flow of the oxygen.

Finally, as illustrated in FIG. 16, a conductor 22 is formed (S18). In this manner, the structure of the transistor according to the first embodiment explained with reference to FIG. 3 is completed.

The annealing treatment at S17 may be conducted at any timing after the completion of the operation at S16.

(1-3) Advantageous Effects

According to the first embodiment, the performance of the transistor can be improved.

The number of oxygen vacancies, which serve as carriers in the oxide semiconductor, is controlled, for example by the annealing treatment. If the oxygen supply route to the oxide semiconductor is restricted at the time of the annealing treatment, the distribution of oxygen vacancies would become uneven. In a vertical transistor, uneven distribution of oxygen vacancies in the vertical direction tends to increase the resistivity in areas with fewer oxygen vacancies, which impairs the current supply capability at the time of turning the transistor on.

According to the present embodiment, the transistor includes an insulator 33. This insulator 33 provides a passage for oxygen during the annealing treatment, enabling the oxygen to be supplied entirely to the semiconductor 32. As a result, the distribution of oxygen vacancies becomes approximately uniform in the semiconductor 32 in the vertical direction, thus improving the current supply capability of the transistor.

The intensity of the electric field generated from the gate electrode decreases in accordance with the distance from the gate electrode. In a vertical transistor, the electric field applied to the inner portion of the channel is weaker than the electric field applied to the outer portion of the channel. Because of the weak electric field applied to the inner portion of the channel, the inner portion often fails to be sufficiently brought into an off state at the time of turning the transistor off, deteriorating the current cutoff capability of the transistor.

In the semiconductor 32 of the transistor according to the present embodiment, the concentration of a metallic element with the largest oxygen-bonding energy, such as gallium, among the metallic elements contained in the semiconductor 32, is higher towards the inside on the XY plane. With the higher concentration of the metallic element with the largest oxygen-bonding energy, a larger number of oxygen vacancies are filled in at annealing, as a result of which the resistivity is increased. That is, the transistor according to the present embodiment includes the semiconductor 32, which has a higher resistivity toward the inside thereof. With the higher resistivity toward the inside of the channel where the electric field from the gate is weaker, a leak current can be suppressed at the time of turning the transistor off, and the current cutoff capability of the transistor can be improved.

The semiconductor 32 including the first layer 32a, second layer 32b, and third layer 32c has been discussed, which is not a limitation. The semiconductor 32 will suffice with at least two semiconductor layers.

(1-4) Modification Examples of First Embodiment

According to the first embodiment, the structure with the insulator 33 has been discussed. The insulator 33 may be omitted, however. That is, the operation at S15 may be omitted from the process explained with reference to FIGS. 7 and 13. FIG. 17 is a cross-sectional view showing the configuration of a transistor according to a modification example of the first embodiment. The modification example of the first embodiment differs from the first embodiment in the omitted operation of S15. As illustrated in FIG. 17, the transistor according to the modification example of the first embodiment contains an air gap. In the transistor according to the modification example of the first embodiment, the area in which the insulator 33 is provided in the first embodiment is replaced with an air gap VO. With such a configuration, the air gap VO serves as a passage in the same manner as the insulator 33 of the first embodiment. Thus, the performance of the transistor can be improved in the same manner as in the first embodiment.

According to the first embodiment, the lower end of the insulator 33 is positioned at a level between the conductor 21 and the conductor 23. The lower end of the insulator 33 may be positioned at the same level as the conductor 23, or at a level between the conductor 23 and the conductor 22.

When downstream operations are performed after the formation of the semiconductor 32 in the manufacturing process of a semiconductor memory device, oxygen tends to be released from the semiconductor 32 due to the heat generated during the downstream operations, and oxygen vacancies tend to increase in the semiconductor 32. This increase in oxygen vacancies is observed more pronouncedly in the upper portion of the semiconductor 32 as the lower end of the insulator 33 becomes positioned at a higher level. This means that, by adjusting the position of the lower end of the insulator 33, the difference in resistivity between the upper portion and lower portion of the semiconductor 32 can be reduced.

For instance, when the contact area of the semiconductor 32 and conductor 22 is smaller than the contact area of the semiconductor 32 and conductor 21, the resistivity of the upper portion of the semiconductor 32 may be lowered in order to reduce the difference in contact resistance between the upper portion and lower portion of the transistor. The positional adjustment of the lower end of the insulator 33 serves effectively as a means for realizing this resistivity lowering.

(2) Second Embodiment

The semiconductor memory device according to the second embodiment differs from the semiconductor memory device according to the first embodiment in the shapes of the semiconductor 32 and insulator 33. The semiconductor memory device according to the second embodiment will be described, focusing on the differences with respect to the first embodiment.

(2-1) Configuration

(2-1-1) Transistor

Figure 18:
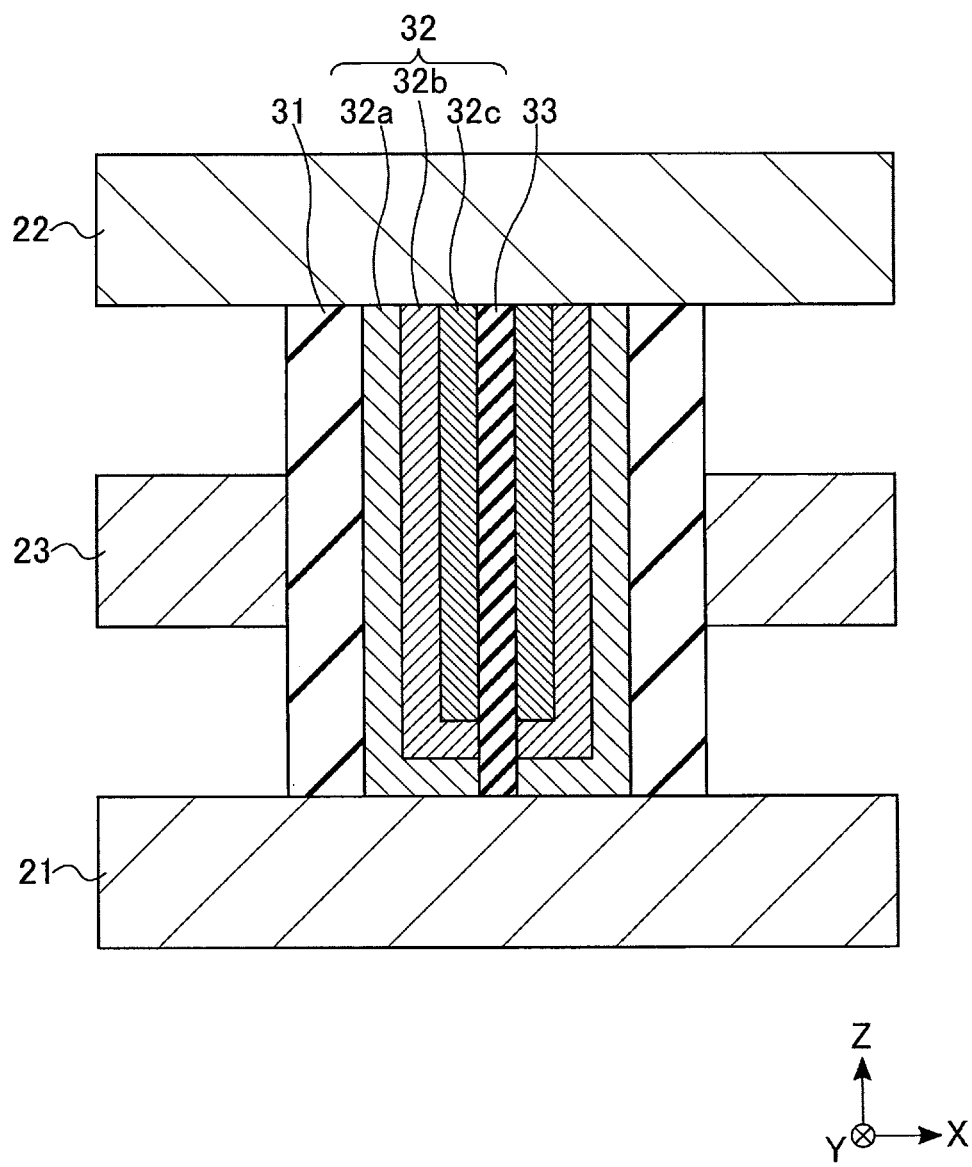
FIG. 18 is a cross-sectional view showing the configuration of a transistor in a semiconductor memory device according to the second embodiment.

FIG. 18 is a cross-sectional view showing the configuration of a transistor in the semiconductor memory device according to the second embodiment. In comparison with the transistor according to the first embodiment, the lower end of the insulator 33 in the transistor according to the second embodiment penetrates the semiconductor 32 and is brought into contact with the conductor 21.

The insulator 33 extends in the Z direction. The upper surface of the insulator 33 is in contact with the conductor 22, while the bottom surface of the insulator 33 is in contact with the conductor 21. The insulator 33 may contain a silicon oxide. The insulator 33 has a film density lower than that of the insulator 31 so as to allow, for example, oxygen to permeate.

The semiconductor 32 serves as a channel of the transistor CT. The semiconductor 32 is in contact with the side surface of the insulator 33, establishing an electrical connection with the conductor 21 and with the conductor 22. In particular, the third layer 32c is in contact with part of the side surface of the insulator 33, and the upper surface of the third layer 32c is in contact with the conductor 22. The second layer 32b is in contact with the side surface and bottom surface of the third layer 32c and part of the side surface of the insulator 33, and the upper surface of the second layer 32b is in contact with the conductor 22. The first layer 32a is in contact with the side surface and bottom surface of the second layer 32b and part of the side surface of the insulator 33. The upper surface of the first layer 32a is in contact with the conductor 22, and the bottom surface thereof is in contact with the conductor 21.

The rest of the configuration of the semiconductor memory device according to the second embodiment is the same as that of the first embodiment.

(2-2) Manufacturing Method

Figure 19:
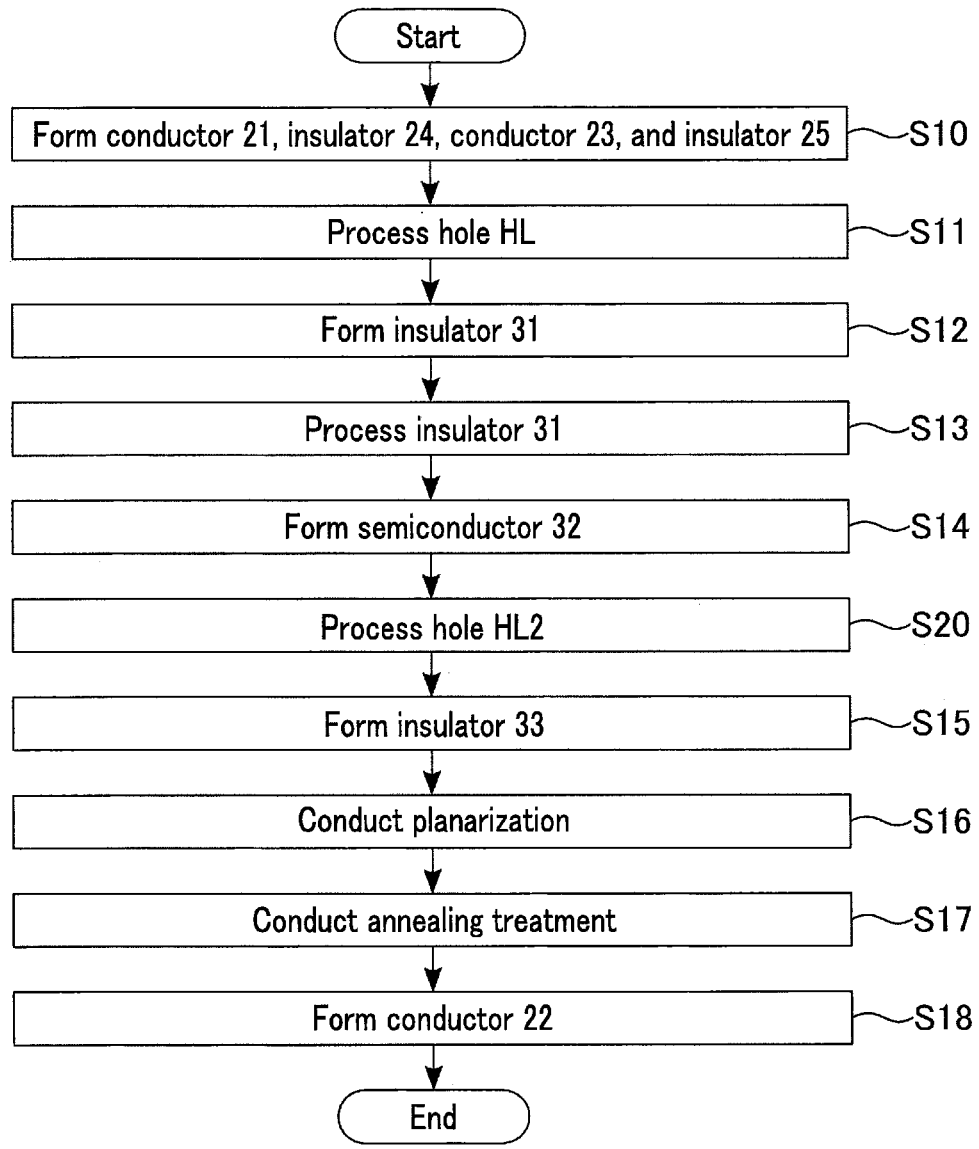
FIG. 19 is a flowchart of an exemplary manufacturing method for the semiconductor memory device according to the second embodiment.

FIG. 19 is a flowchart of an exemplary manufacturing method for the semiconductor memory device according to the second embodiment. FIG. 20 is a cross-sectional view showing an exemplary cross-sectional structure of the semiconductor memory device according to the second embodiment in the manufacturing process. The illustrated cross-sectioned structure corresponds to the area in FIG. 18. As indicated in FIG. 19, the operations at S10 to S14, S20, and S15 to S18 are sequentially performed in the manufacturing process of the semiconductor memory device according to the second embodiment. An exemplary manufacturing process will be described by suitably referring to FIG. 19.

The operations at S10 to S14 are the same as those for the transistor according to the first embodiment.

Then, as illustrated in FIG. 20, a hole HL2 is formed (S20). In particular, portions of the third layer 32c, second layer 32b, and first layer 32a are removed through anisotropic etching such as RIE, as a result of which the hole HL2 is formed with part of the conductor 21 exposed at the bottom of the hole HL2.

The operations at S15 to S18 are the same as those for the transistor according to the first embodiment. In this manner, the structure of the transistor according to the second embodiment explained with reference to FIG. 18 is completed.

(2-3) Advantageous Effects

According to the second embodiment, the performance of the transistor can be improved in the same manner as in the first embodiment.

According to the second embodiment, the bottom end of the insulator 33 is in contact with the conductor 21. With such a structure, oxygen can be sent all the way down to the lower portion of the semiconductor 32 during the annealing treatment. Thus, in the same manner as in the first embodiment, oxygen vacancies can be approximately uniformly distributed throughout the semiconductor 32 in the vertical direction, which improves the current supply capability of the transistor.

(3) Third Embodiment

The semiconductor memory device according to the third embodiment differs from the semiconductor memory device according to the first embodiment in the structure of the semiconductor 32. The semiconductor memory device according to the third embodiment will be described below, focusing on differences with reference to the first embodiment.

(3-1) Configuration

(3-1-1) Transistor

Figure 21:
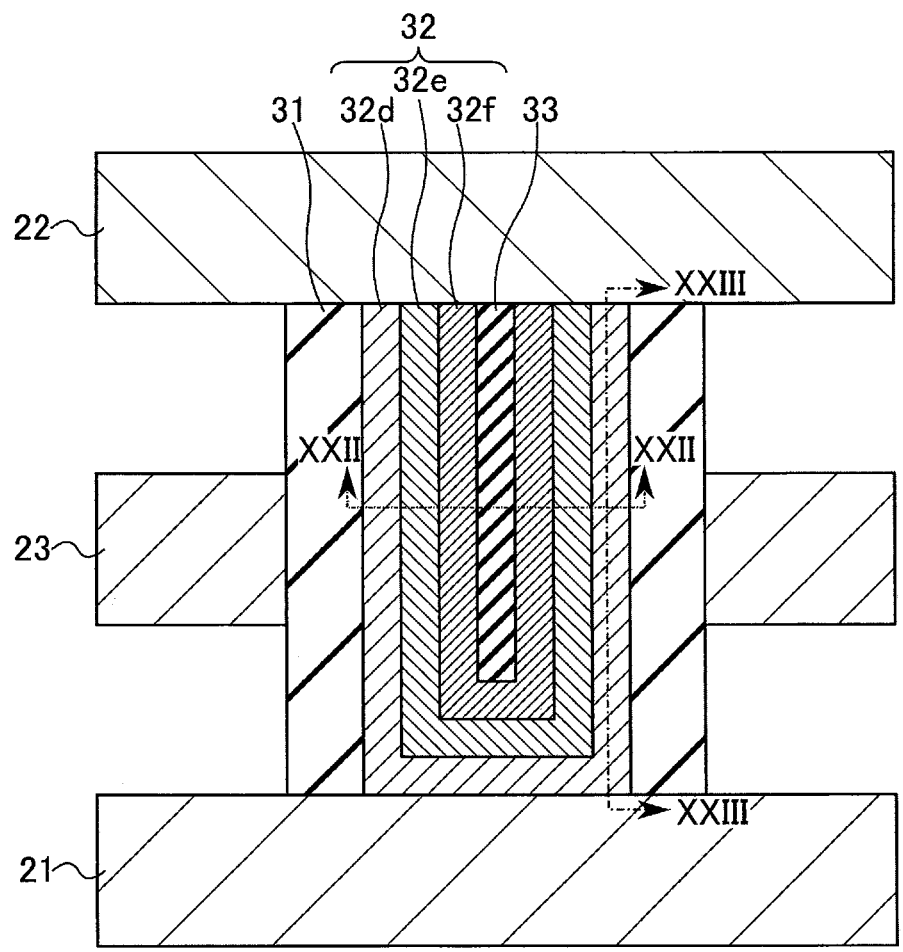
FIG. 21 is a cross-sectional view showing the configuration of a transistor in a semiconductor memory device according to the third embodiment.

FIG. 21 is a cross-sectional view showing the configuration of a transistor in the semiconductor memory device according to the third embodiment. In the transistor according to the third embodiment, layers included in the semiconductor 32 differ from those in the transistor according to the first embodiment. In the transistor according to the third embodiment, the semiconductor 32 includes the first layer 32d in place of the first layer 32a, the second layer 32e in place of the second layer 32b, and the third layer 32f in place of the third layer 32c. In the first layer 32d, second layer 32e, and third layer 32f, the oxide semiconductor is doped with an element having a larger oxygen-bonding energy, such as carbon (C), hafnium (Hf), silicon (Si), and aluminum (Al), than that of any of the metallic elements contained in the oxide semiconductor. In the third embodiment, it is assumed that, for the semiconductor 32, a semiconductor including an oxide of In, Ga, and Zn is doped with C.

FIG. 22 is a graph showing the properties of a transistor in the semiconductor memory device according to the third embodiment. FIG. 22 represents the properties for the configuration of FIG. 21 taken along line XXII-XXII. More specifically, the graph of FIG. 22 indicates the concentration of an element with the largest oxygen-bonding energy among the elements added to the oxide semiconductor, the density of oxygen vacancies Vo-, and the resistivity $\rho$. In the example according to the third embodiment, carbon is the element with the largest oxygen-bonding energy among the elements added to the oxide semiconductor. As indicated in FIG. 22, the concentration of carbon in the semiconductor 32 is higher toward the inside on the XY plane. In particular, the carbon concentration in the third layer 32f is higher than the carbon concentration in the second layer 32e. The carbon concentration in the second layer 32e is higher than the carbon concentration in the first layer 32d. In the semiconductor 32, the density of oxygen vacancies increases toward the outside on the XY plane. In particular, the density of oxygen vacancies in the first layer 32d is higher than the density of oxygen vacancies in the second layer 32e. The density of oxygen vacancies in the second layer 32e is higher than the density of oxygen vacancies in the third layer 32f. In the semiconductor 32, the resistivity increases toward the inside on the XY plane. In particular, the resistivity of the third layer 32f is higher than the resistivity of the second layer 32e. The resistivity of the second layer 32e is higher than the resistivity of the first layer 32d.

Figure 23:
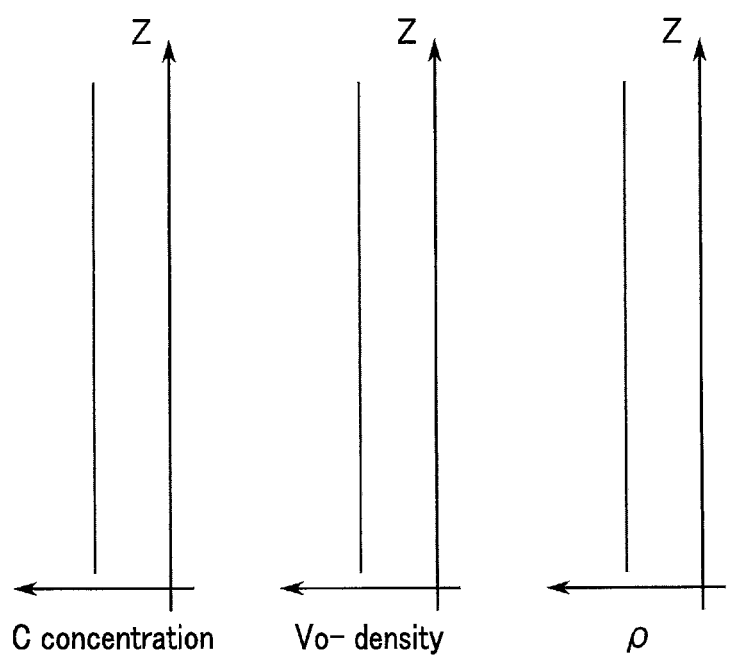
FIG. 23 is a graph showing the properties of the transistor in the semiconductor memory device according to the third embodiment.

FIG. 23 is a graph showing the properties of a transistor in the semiconductor memory device according to the third embodiment. FIG. 23 represents the properties for the configuration of FIG. 21 taken along line XXIII-XXIII. As shown in FIG. 23, the semiconductor 32 has an approximately uniform value in the Z direction for each of the carbon concentration, the density of oxygen vacancies Vo-, and the resistivity $\rho$.

The rest of the configuration of the semiconductor memory device according to the third embodiment is the same as that of the first embodiment.

(3-2) Manufacturing Method

FIG. 24 is a flowchart of an exemplary manufacturing method for the semiconductor memory device according to the third embodiment. FIG. 25 is a cross-sectional view showing an exemplary cross-sectional structure of the semiconductor memory device according to the third embodiment in the manufacturing process. The illustrated cross-sectioned structure corresponds to the area in FIG. 21. As indicated in FIG. 24, the operations at S10 to S13, S30 to S32, and S15 to S18 are sequentially performed in the manufacturing process of the semiconductor memory device according to the third embodiment. An exemplary manufacturing process will be described by suitably referring to FIG. 24.

The operations at S10 to S13 are the same as those for the transistor according to the first embodiment.

Then, the first layer 32d is formed (S30). In particular, an oxide semiconductor layer 50a is formed on the upper surface of the insulator 25, the upper surface and side wall of the insulator 31, and the upper surface of the conductor 21. As illustrated in FIG. 25, carbon ions are implanted into this oxide semiconductor layer 50a to form the first layer 32d. Arrows 60 in FIG. 25 represent the carbon ion implantation.

Next, the second layer 32e is formed (S31). In particular, an oxide semiconductor layer 50b is formed on the upper surface and side wall of the first layer 32d. Then, carbon ions are implanted into this oxide semiconductor layer 50b to form the second layer 32e in such a manner that the resultant second layer 32e will have a carbon concentration higher than that of the first layer 32d.

Thereafter, the third layer 32f is formed (S32). In particular, an oxide semiconductor layer 50c is formed on the upper surface and side wall of the second layer 32e. Then, carbon ions are implanted into this oxide semiconductor layer 50c to form the third layer 32f in such a manner that the resultant third layer 32f will have a carbon concentration higher than that of the second layer 32e.

The operations at S15 to S18 are the same as those for the transistor according to the first embodiment. In this manner, the structure of the transistor according to the third embodiment explained with reference to FIG. 21 is completed.

(3-3) Advantageous Effects

According to the third embodiment, the performance of the transistor can be improved in the same manner as in the first embodiment.

In the third embodiment, the concentration of carbon implanted into the oxide semiconductor is higher toward the inside on the XY plane. That is, the transistor according to the third embodiment includes the semiconductor 32, which has a higher resistivity toward the inside thereof. The transistor according to the third embodiment can thereby improve the current cutoff capability of the transistor in the same manner as in the transistor according to the first embodiment.

The semiconductor 32 including the first layer 32d, second layer 32e, and third layer 32f has been discussed, which is not a limitation. The semiconductor 32 will suffice with two or more semiconductor layers.

(4) Others

Throughout the specification, the expression "coupling" refers to electrical coupling, which may include coupling by way of other elements. The state of being "electrically coupled" may include an insulator interposed between the connected components as long as the components are able to operate in the same manner as when electrically directly connected.

The embodiments of the present invention have been explained. These are presented merely as examples and are not intended to restrict the scope of the invention. These novel embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

What is claimed is:

1. A semiconductor memory device comprising:
a cell capacitor and a transistor,
wherein the cell capacitor includes a first electrode coupled to a plate line and a second electrode coupled to the transistor, the transistor includes a first conductor, a second conductor, and a third conductor, which are aligned in a first direction and separated from each other;
a semiconductor including a metal oxide and extending in the first direction to be in contact with the first conductor and the third conductor;
a first insulator arranged between the semiconductor and the second conductor; and
an insulation region surrounded by the semiconductor and extending in the first direction to be in contact with the first conductor,
wherein the semiconductor includes a first portion and a second portion defined between the first portion and the insulation region, and
a concentration of a first element contained in the metal oxide of the semiconductor is higher in the second portion than in the first portion.

2. The semiconductor memory device according to claim 1, wherein
the second conductor is arranged between the first conductor and the third conductor.

3. The semiconductor memory device according to claim 1, wherein
the second conductor surrounds the semiconductor.

4. The semiconductor memory device according to claim 1, wherein
the insulation region is in contact with the semiconductor.

5. The semiconductor memory device according to claim 1, wherein
the first element is a metallic element and has an oxygen-bonding energy that is largest among metallic elements included in the metal oxide.

6. The semiconductor memory device according to claim 1, wherein
the first element is gallium or aluminum.

7. The semiconductor memory device according to claim 1, wherein
the first element has an oxygen-bonding energy that is largest among elements included in the semiconductor.

8. The semiconductor memory device according to claim 1, wherein
the first element is carbon, hafnium, or silicon.

9. The semiconductor memory device according to claim 1, wherein
the insulation region includes a silicon oxide.

10. The semiconductor memory device according to claim 1, wherein
the insulation region is a void.

11. The semiconductor memory device according to claim 1, wherein
part of the semiconductor is arranged between the insulation region and the third conductor.

12. The semiconductor memory device according to claim 1, wherein
the insulation region is in contact with the third conductor.

13. The semiconductor memory device according to claim 1, wherein the second electrode of the cell capacitor is electrically coupled to the first conductor or the third conductor.

14. The semiconductor memory device according to claim 1, wherein
the first insulator is a gate insulating film of the transistor.

* * * * *